United States Patent
Kwak et al.

(10) Patent No.: US 9,496,038 B1
(45) Date of Patent: *Nov. 15, 2016

(54) THREE-DIMENSIONAL FLASH MEMORY DEVICE INCLUDING DUMMY WORD LINE

(71) Applicant: SAMSUNG ELECTRONICS CO., LTD., Suwon-Si, Gyeonggi-Do (KR)

(72) Inventors: Donghun Kwak, Hwaseong-si (KR); Sang-Wan Nam, Hwaseong-si (KR); Daeseok Byeon, Seongnam-si (KR); Chiweon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/091,843

(22) Filed: Apr. 6, 2016

(30) Foreign Application Priority Data

Jun. 30, 2015 (KR) .......................... 10-2015-0093586

(51) Int. Cl.
*G11C 16/04* (2006.01)
*G11C 16/28* (2006.01)
*G11C 16/26* (2006.01)

(52) U.S. Cl.
CPC .......... *G11C 16/0483* (2013.01); *G11C 16/26* (2013.01); *G11C 16/28* (2013.01)

(58) Field of Classification Search
None
See application file for complete search history.

(56) References Cited

U.S. PATENT DOCUMENTS

| 7,301,815 | B2* | 11/2007 | Kurata | G11C 8/14 365/185.2 |
| 7,679,133 | B2 | 3/2010 | Son et al. | |
| 8,154,927 | B2 | 4/2012 | Lee et al. | |
| 8,553,466 | B2 | 10/2013 | Han et al. | |
| 8,559,235 | B2 | 10/2013 | Yoon et al. | |
| 8,654,587 | B2 | 2/2014 | Yoon et al. | |
| 8,891,315 | B2 | 11/2014 | Lee et al. | |
| 2008/0239814 | A1* | 10/2008 | Cho | G11C 8/14 365/185.13 |
| 2011/0075484 | A1 | 3/2011 | Lee et al. | |
| 2011/0233648 | A1 | 9/2011 | Seol et al. | |
| 2012/0307561 | A1 | 12/2012 | Joo et al. | |
| 2013/0032949 | A1 | 2/2013 | Lin et al. | |
| 2013/0314995 | A1 | 11/2013 | Dutta et al. | |
| 2013/0332659 | A1 | 12/2013 | Maejima | |
| 2014/0334230 | A1 | 11/2014 | Kwon | |
| 2014/0334232 | A1 | 11/2014 | Nam et al. | |

FOREIGN PATENT DOCUMENTS

| KR | 1020110034068 | 4/2011 |
| KR | 1020120134941 | 12/2012 |
| KR | 1020130137470 | 12/2013 |
| KR | 1020140133268 | 11/2014 |

* cited by examiner

*Primary Examiner* — James G Norman
(74) *Attorney, Agent, or Firm* — Volentine & Whitt, PLLC

(57) ABSTRACT

A three-dimensional flash memory device includes a plurality of cell strings arranged in a direction perpendicular to a substrate. The three-dimensional flash memory includes a first dummy word line disposed between a ground selection line and a main word line, and a second dummy word line disposed between the main word line and a string selection line and being asymmetric with respect to the first dummy word line. Voltages of different levels are respectively applied to the first and second dummy word lines during a read operation.

20 Claims, 20 Drawing Sheets

ABSTRACT
THREE-DIMENSIONAL FLASH MEMORY DEVICE INCLUDING DUMMY WORD LINE

CROSS-REFERENCE TO RELATED APPLICATIONS

A claim for priority under 35 U.S.C. §119 is made to Korean Patent Application No. 10-2015-0093586 filed Jun. 30, 2015, in the Korean Intellectual Property Office, the entire contents of which are hereby incorporated by reference.

BACKGROUND

Embodiments of the disclosure relate to semiconductor memory devices, and more particularly, to a three-dimensional flash memory device and a data storage device including the same.

Semiconductor memory devices are generally classified into volatile memory devices such as a dynamic random access memory (DRAM), a static random access memory (SRAM), and the like and nonvolatile memory devices such as an electrically erasable programmable read only memory (EEPROM), a ferroelectric random access memory (FRAM), a phase-change random access memory (PRAM), a magneto-resistive random access memory (MRAM), a flash memory, and the like. The volatile memory devices lose data stored therein when power is cut off, and the nonvolatile memory devices retain data stored therein even though power is cut off. Especially, the nonvolatile memory devices have an advantage such as high program speed, low power consumption, mass data storage, and the like. Thus, a data storage device including a flash memory may be widely used as a data storage medium.

The degree of integration of the flash memory is increasing to maintain good performance and cost competitiveness required by end users. However, a degree of integration of a two-dimensional (2D) flash memory may be limited due to a manufacturing process. For this reason, a three-dimensional flash memory is proposed. The degree of integration of the 3D flash memory is increased; however, the data reliability of the 3D flash memory is reduced due to program disturbance at a program operation or read disturbance at a read operation.

SUMMARY

Embodiments of the disclosure are directed to form upper dummy word lines and lower dummy word lines asymmetrically, thereby reducing program disturbance. Embodiments of the disclosure are further directed to apply different voltage levels to upper dummy word lines and lower dummy word lines asymmetrically formed, thereby reducing read disturbance.

Embodiments of the disclosure provide a three-dimensional flash memory device having a plurality of cell strings arranged in a direction perpendicular to a substrate. The three-dimensional flash memory may include a first dummy word line disposed between a ground selection line and a main word line and a second dummy word line disposed between the main word line and a string selection line and being asymmetric with respect to the first dummy word line. Voltages of different levels are respectively applied to the first and second dummy word lines during a read operation.

The three-dimensional flash memory device may further include a voltage generator generating first and second dummy word line voltages to be applied to the first and second dummy word lines and a control logic controlling the voltage generator. During the read operation, the control logic may set the first and second dummy word line voltages to different voltage levels such that a difference between an electric field, formed between a channel of the main word line and the ground selection line, and an electric field, formed between a channel of the main word line and the string selection line, is reduced.

A distance between the first dummy word line and the ground selection line and a distance between the second dummy word line and the string selection line may be set to be different from each other.

The number of word lines appointed as the first dummy word line may be different from the number of word lines appointed as the second dummy word line.

A width of the first dummy word line may be different from a width of the second dummy word line.

Embodiments of the disclosure also provide a three-dimensional flash memory device which includes a plurality of cell strings arranged in a direction perpendicular to a substrate. The three-dimensional flash memory may include a memory cell array comprising upper and lower dummy word lines being asymmetric in structure; a voltage generator generating voltages to be applied to the upper and lower dummy word line; and a control logic controlling the memory cell array and the voltage generator. The control logic may control the memory cell array and the voltage generator such that voltages of different levels are applied to the upper and lower dummy word lines, respectively.

The memory cell array may further include a plurality of cell strings connected between a bit line and a common source line and a plurality of string selection lines selecting a cell string, in which a read operation is performed, from among the cell strings. The control logic may adjust a difference between a voltage to be applied to the upper dummy word line and a voltage to be applied to the lower dummy word line based on the number of bits of data stored in each of memory cells included in a cell string, in which the read operation is not performed, from among the cell strings.

The control logic may adjust a difference between a voltage to be applied to the upper dummy word line and a voltage to be applied to the lower dummy word line based on a program/erase cycle of memory cells included in a cell string, in which the read operation is not performed, from among the cell strings.

The control logic may adjust a difference between a voltage to be applied to the upper dummy word line and a voltage to be applied to the lower dummy word line based on a change in an external temperature.

The control logic may adjust a difference between a voltage to be applied to the upper dummy word line and a voltage to be applied to the lower dummy word line based on a location of a memory block in which a read operation is performed.

The number of word lines appointed as the upper dummy word line may be different from the number of word lines appointed as the lower dummy word line.

Embodiments of the disclosure may additionally provide a three-dimensional non-volatile memory device having a substrate, a cell string disposed perpendicular to the substrate, and a plurality of memory cells, within the cell string, that are electrically and serially connected between a bit line and a common source line. Each of the memory cells may be controlled by a different word line, and the distance between the common source line and a first one of the memory cells that is closest to the common source line differs from the distance between the bit line and a second one of the memory cells that is closest to the bit line.

The difference may equal or exceed about twice the length of each of the memory cells.

The distance difference may reduce, during a read operation of one of the memory cells, a difference between an electrical field, formed between the first memory cell and the common source line, and an electrical field, formed between the second memory cell and the bit line.

The difference in electrical fields may be reduced proportionately to the memory cell length.

The distance between the common source line and the first memory cell may correspond to the length of one or more memory cells that are electrically and serially connected between the common source line and the first memory cell. The distance between the bit line and the second memory cell may correspond to the length of one or more memory cells that are electrically and serially connected between the bit line and the second memory cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the disclosure will be described in detail with reference to the attached drawings to the extent that the scope of the disclosure is easily implemented by a person of ordinary skill in the art to which the disclosure belongs.

Figure 1:
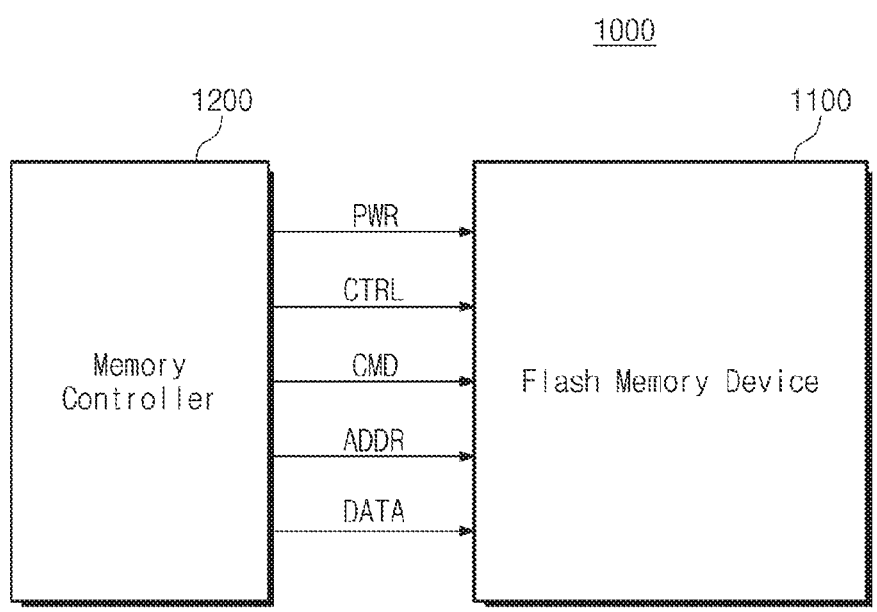
FIG. 1 is a block diagram illustrating a data storage device according to embodiments of the disclosure.

FIG. 1 is a block diagram illustrating a data storage device according to embodiments of the disclosure. Referring to FIG. 1, a data storage device 1000 may include a flash memory 1100 and a memory controller 1200. The data storage device 1000 illustrated in FIG. 1 may include at least one flash memory-based data storage medium such as a memory card, universal serial bus (USB) memory device, solid state drive (SSD), and the like.

The flash memory 1100 may perform an erase, write or read operation based on a control of the memory controller 1200. The flash memory 1100 may receive a command CMD, an address ADDR, and data DATA via an input/output (I/O) line. Furthermore, the flash memory 1100 may receive a power supply voltage PWR via a power supply line and may receive a control signal CTRL via a control line. The control signal CTRL may include a command latch enable (CLE) signal, an address latch enable (ALE) signal, a chip enable (nCE) signal, a write enable (nWE) signal, a read enable (nRE) signal, and the like.

According to embodiments of the disclosure, the flash memory 1100 may include three-dimensional memory cell block, and the three-dimensional memory cell block comprises a plurality of memory strings perpendicular to the substrate. The flash memory 1100 may include a three-dimensional memory cell block having a structure where an upper dummy word line and a lower dummy word line are asymmetric. Since the upper dummy word line and the lower dummy word line are asymmetric in structure, the flash memory 1100 may prevent reliability of data from being reduced due to, for example, program disturbance and the like.

Furthermore, during a read operation, the flash memory 1100 may apply voltages of different levels to the upper dummy word line and the lower dummy word line, respectively. The voltages applied to the upper and lower dummy word lines which are asymmetric in structure may be controlled independently of each other, thereby preventing a decrease in reliability of data due to read disturbance and the like. A configuration and an operation of the flash memory 1100 will be described in more detail with reference to the following drawings.

Figure 2:
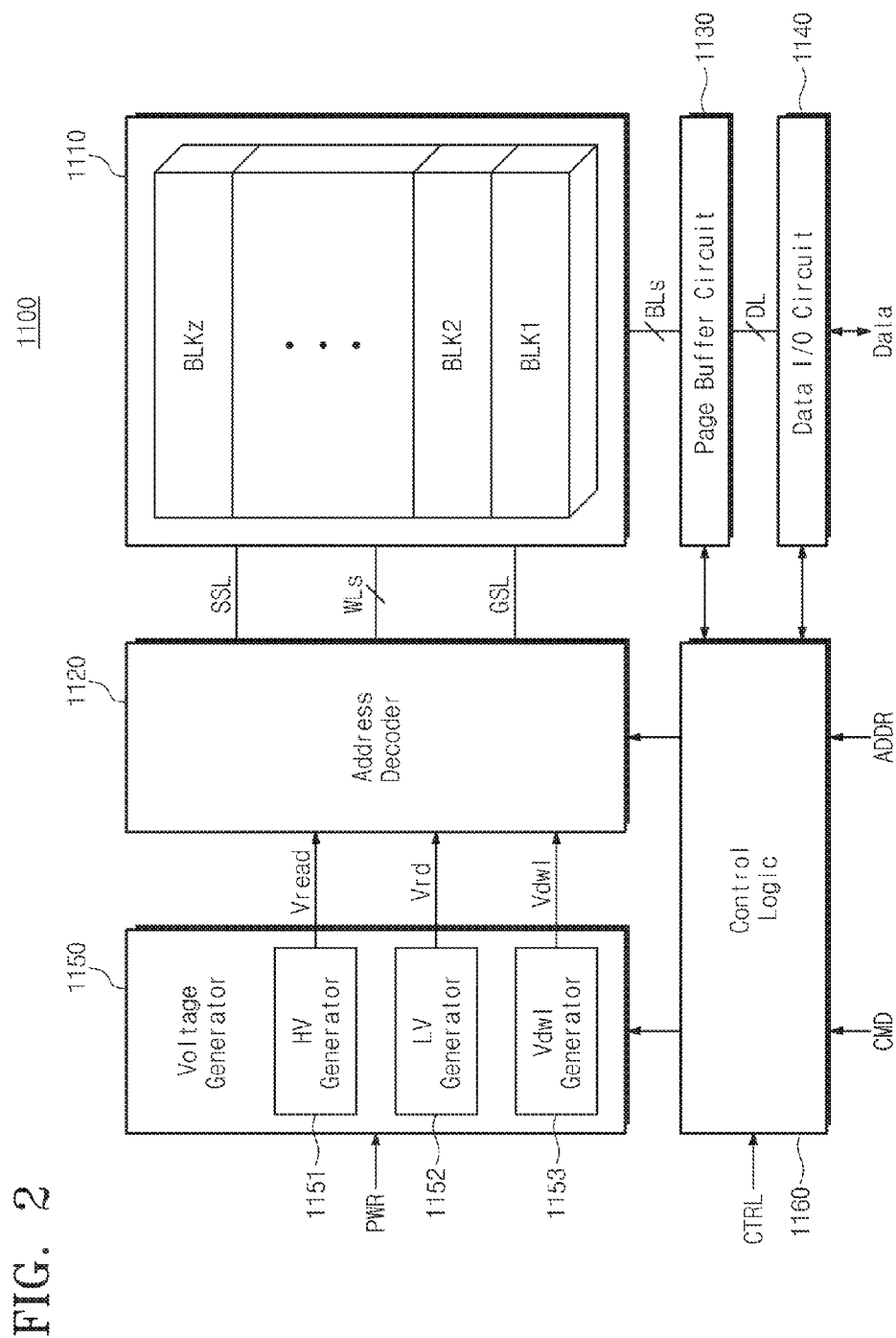
FIG. 2 is a block diagram exemplarily illustrating an embodiment of the flash memory illustrated in FIG. 1.

FIG. 2 is a block diagram illustrating a flash memory illustrated in FIG. 1. Referring to FIG. 2, the flash memory 1100 may include a memory cell array 1110, an address decoder 1120, a page buffer 1130, a data input/output (I/O) circuit 1140, a voltage generator 1150, and control logic 1160.

The memory cell array 1110 may include a plurality of memory blocks BLK1 to BLKz, each of which has a three-dimensional structure or a vertical structure. For example, memory cells of a memory block having the 3D structure may be formed in a direction perpendicular to a substrate.

Each memory block may include a plurality of word lines and a plurality of memory cells, and a plurality of memory cells may be connected to a word line. A set of memory cells which are connected to a word line and are programmed at the same time may be referred to as "page". The flash memory 1100 may perform an erase operation in a memory block unit and a read or write operation in a page unit.

Each memory cell may store one data bit or two or more data bits. A memory cell which stores one bit may be referred to as "single-level cell" (SLC) or "single bit cell".

A memory cell which stores two or more bits may be referred to as "multi-level cell" (MLC) or "multi-bit cell".

Each memory block may include an upper dummy word line and a lower dummy word line, and the upper dummy word line and the lower dummy word line may be implemented to have an asymmetrical structure. For example, the upper dummy word line and the lower dummy word line may be implemented to have the asymmetric structure in terms of the number of word lines assigned to a dummy word line, a distance between the dummy word line and a selection line (e.g., string selection line SSL or ground selection line GSL), a width of the dummy word line, and the like. The upper dummy word line and the lower dummy word line may be asymmetric in structure, thereby preventing a decrease in reliability of data due to program disturbance.

The address decoder 1120 may be coupled to the memory cell array 1110 via the selection lines SSL and GSL or word lines WLs. The address decoder 1120 may receive a dummy word line voltage Vdwl from the voltage generator 1150 and may be controlled by the control logic 1160. The address decoder 1120 may select a word line during a program or read operation. A program or read voltage may be applied to the selected word line.

The page buffer circuit 1130 may be coupled to the memory cell array 1110 via a plurality of bit lines BLs. The page buffer circuit 1130 may include a plurality of page buffers (not illustrated). One page buffer may be connected to one bit line or two or more bit lines. The page buffer circuit 1130 may be used to temporarily store data to be programmed at a selected page or data read therefrom.

The data I/O circuit 1140 may be connected to the page buffer circuit 1130 via data lines DL and to the memory controller 1200 (refer to FIG. 1) via I/O lines. The data I/O circuit 1140 may receive program data DATA from the memory controller 1200 during a program operation and may provide read data DATA to the memory controller 1200 during a read operation.

The voltage generator 1150 may receive a power supply voltage PWR from the memory controller 1200 and may generate word line voltages needed for a read or write operation. The word line voltages may be provided to the address decoder 1120. The voltage generator 1150 may include a high voltage generator 1151, a low voltage generator 1152, and a dummy word line voltage generator 1153.

The high voltage generator 1151 may generate a relatively high voltage such as a non-selection read voltage Vread, a program voltage Vpgm, a pass voltage Vpass, and the like. The low voltage generator 1152 may generate a relatively low voltage such as a selection read voltage Vrd, a read verify voltage Vvfy, and the like. The dummy word line voltage generator 1153 may generate, for example, voltages to be provided to the upper or lower dummy word lines, which are asymmetrical in structure, during a read operation. The dummy word line voltage generator 1153 may generate voltages of different levels during a read operation.

An embodiment of the disclosure is exemplified in FIG. 2 in which the high voltage generator 1151, the low voltage generator 1152 and the dummy word line generator 1153 are physically independent of each other. However, the scope of the disclosure may not be limited thereto. For example, the dummy word line generator 1153 may be implemented as a part of the high voltage generator 1151 or the low voltage generator 1152. Alternatively, the high voltage generator 1151, the low voltage generator 1152 and the dummy word line voltage generator 1153 may be integrated into one pumping circuit.

Referring to FIG. 2, the control logic 1160 may control program, read and erase operations of the flash memory 1100 using a command CMD, an address ADDR, and a control signal CTRL. For example, during a read operation, the control logic 1160 may control the address decoder 1120 such that the selection read voltage Vrd and the non-selection read voltage Vread are respectively applied to a selected word line and an unselected word line and may control the page buffer circuit 1130 and the data I/O circuit 1140 such that data stored at a selected page is read.

In addition, during a read operation, the control logic 1160 may control the voltage generator 1150 such that dummy word line voltages of different levels are generated and may control the address decoder 1120 such that the dummy word line voltages of different levels are respectively applied to the upper and lower dummy word lines asymmetrical in structure. In other words, the level of dummy word line voltage supplied to the upper dummy word line is different from the level of dummy word line voltage supplied to the lower dummy word line, thereby preventing reliability of data from being reduced due to read disturbance.

As described above, the flash memory 1100 according to embodiments of the disclosure may include the upper and lower dummy word lines asymmetrical in structure, thereby preventing reliability of data from being reduced due to program disturbance. The flash memory 1100 according to embodiments of the disclosure may be configured to provide the upper and lower dummy word lines asymmetrical in structure with different levels of voltages respectively, thereby preventing reliability of data from being reduced due to a read disturbance.

Figure 3:
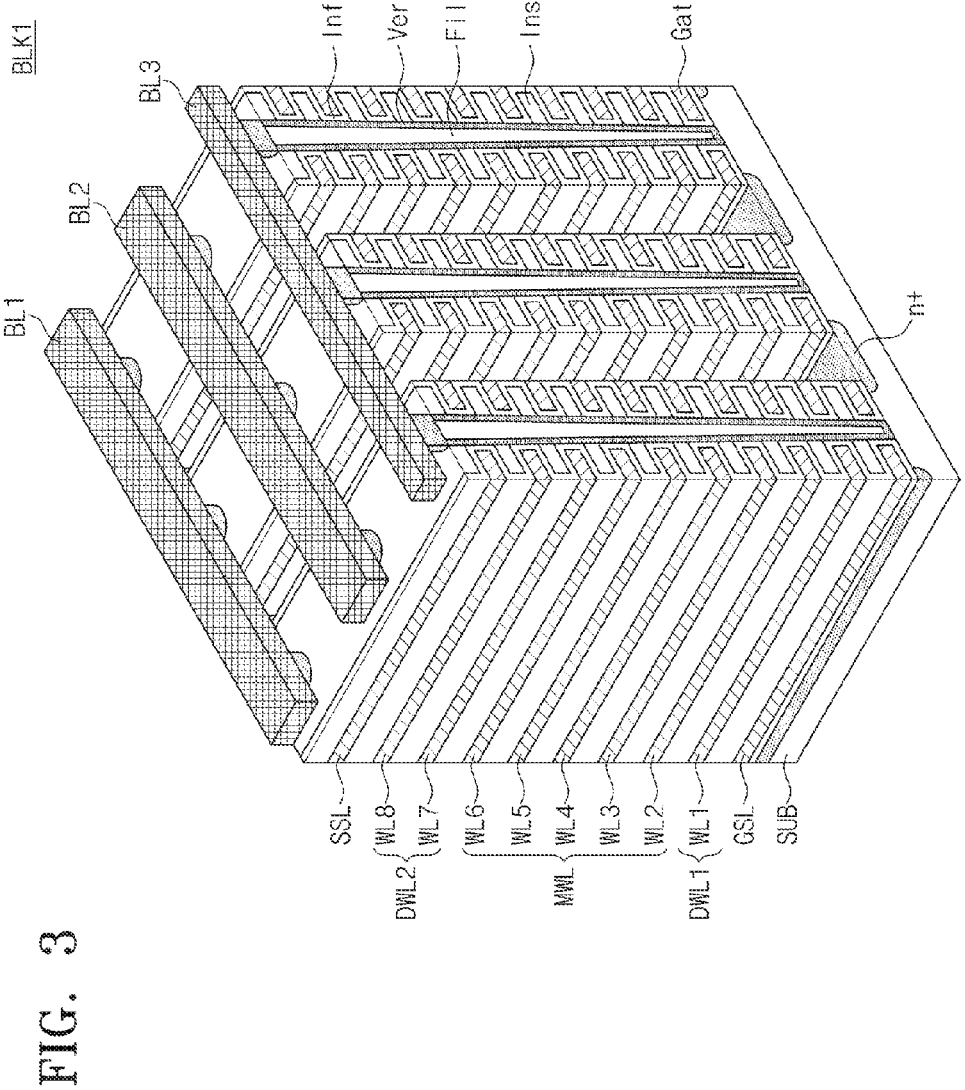
FIG. 3 is a perspective view exemplarily illustrating an embodiment of a three-dimensional structure of a memory block illustrated in FIG. 2.

FIG. 3 is a perspective view of a three-dimensional structure of a memory block BLK1 illustrated in FIG. 2. In FIG. 3, an embodiment of the disclosure is exemplified in which an upper dummy word line and a lower dummy word line are asymmetric in terms of the number of word lines appointed as dummy word lines. Furthermore, for descriptive convenience, it may be assumed that the memory block BLK1 includes two upper dummy word lines and one lower dummy word line.

Referring to FIG. 3, the memory block BLK1 may be formed in a direction perpendicular to a substrate SUB. An n+ doping region may be formed in the substrate SUB. A gate electrode layer and an insulating layer may be alternately stacked on the substrate SUB.

An information storage layer may be formed between the gate electrode layer and the insulating layer. The information storage layer may include a tunnel storage layer, a charge storage layer and a blocking insulating layer.

When the gate electrode layer and the insulating layer are patterned in a vertical direction, a V-shaped pillar may be formed. The pillar may be connected to the substrate SUB through the gate electrode layer and the insulating layer. An inner portion of the pillar may be a filing dielectric pattern and may be formed of an insulating material such as silicon oxide. An outer portion of the pillar may be a vertical active pattern and may be formed of channel semiconductor.

The gate electrode layer of the memory block BLK1 may be connected to a ground selection line GSL, a plurality of word lines WL1 to WL8 and a string selection line SSL. In addition, pillars of the memory block BLK1 may be connected to a plurality of bit lines BL1 to BL3. In FIG. 3, an embodiment of the disclosure is exemplified in which the memory block BLK1 has two selection lines GSL and SSL, eight word lines WL1 to WL8 and three bit lines BL1 to BL3, but the number of lines may be actually more or less than that illustrated in FIG. 3.

Referring to FIG. 3, the word lines of the memory block BLK1 may include main word lines MWL and dummy word lines DWL. The dummy word lines DWL may be for protecting the main word lines MWL and improving pattern uniformity of memory cells. A first dummy word line DWL1 may be disposed between the ground selection line GSL and the main word lines MWL. The first dummy word line DWL1 may be referred to as "lower dummy word line" because it is relatively close to the substrate SUB. A second dummy word line DWL2 may be disposed between the string selection line SSL and the main word lines MWL. The second dummy word line DWL2 may be referred to as an "upper dummy word line" because it is relatively far away from the substrate SUB.

In FIG. 3, an embodiment of the disclosure is exemplified in which the first dummy word line DWL1 includes a first word line WL1 and the second dummy word line DWL2 includes seventh and eighth word lines WL7 and WL8. That is, the number of word lines included in the second dummy word line DWL2 may be greater than that included in the first dummy word line DWL1. The number of word lines included in the second dummy word line DWL2 may be implemented to be greater than that included in the first dummy word line DWL1, thereby preventing reliability of data from being reduced due to program disturbance.

Figure 4:
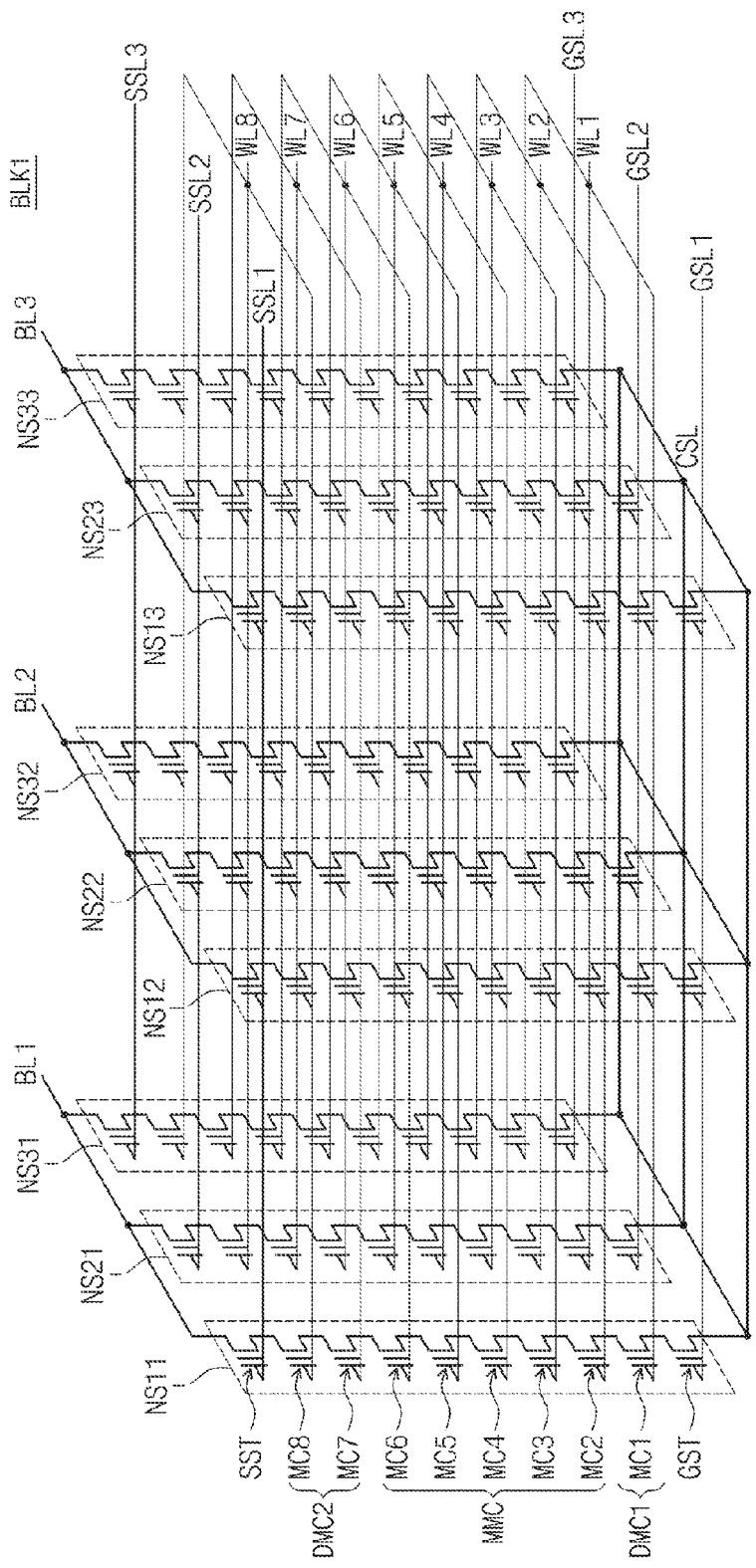
FIG. 4 is an equivalent circuit of a memory block described in FIG. 3.

FIG. 4 is an equivalent circuit of a memory block illustrated in FIG. 3. Referring to FIG. 4, NAND strings NS11 to NS33 may be connected between a common source line CSL and bit lines BL1 to BL3. Each NAND string (e.g., NS11) may include a ground selection transistor GST, a plurality of memory cells MC1 to MC8 and a string selection transistor SST. In this case, the NAND string may be referred to as "cell string".

The string selection transistor SST may be connected to a string selection line SSL. The string selection line SSL may be divided into first through third string selection lines SSL1 to SSL3. The plurality of memory cells MC1 to MC8 may be connected to corresponding word lines WL1 to WL8, respectively. Word lines (e.g., WL4) having the same height may be connected in common.

The ground selection transistor GST may be connected to a ground selection line GSL. The ground selection line GSL may be divided into first to third ground selection lines GSL1 to GSL3. However, the scope of the disclosure may not be limited thereto. For example, the ground selection lines may be connected to each other. The string selection transistor SST may be connected to a bit line BL, and the ground selection transistor GST may be connected to the common source line CSL.

As illustrated in FIG. 4, the memory cells MC of the memory block BLK1 may include a main memory cell MMC and a dummy memory cell DMC. The dummy memory cell DMC may be connected to the dummy word line DWL (refer to FIG. 3), and the main memory cell MMC may be connected to the main word line MWL (refer to FIG. 3). In FIG. 4, the first dummy memory cell DMC1 may be a first memory cell MC1 and may be connected between the ground selection transistor GST and the main memory cell MMC. The second dummy memory cell DMC2 may include seventh and eighth memory cells MC7 and MC8 and may be connected between the string selection transistor SST and the main memory cell MMC.

In the three-dimensional flash memory 1100 (refer to FIG. 2) according to embodiments of the disclosure, the number of memory cells in the first dummy memory cell DMC1 may be different from that in the second dummy memory cell DMC2, thereby preventing reliability of data from being reduced due to program disturbance. This will be described in more detail with reference to FIG. 5 to FIG. 7.

In the 3D flash memory according to embodiments of the disclosure, a voltage provided to the first dummy memory cell DMC1 may be different in level from that provided to the second dummy memory cell DMC2, thereby preventing reliability of data from being reduced due to a read disturbance. This will be described in more detail with reference to FIG. 8 to FIG. 10.

Figure 5:
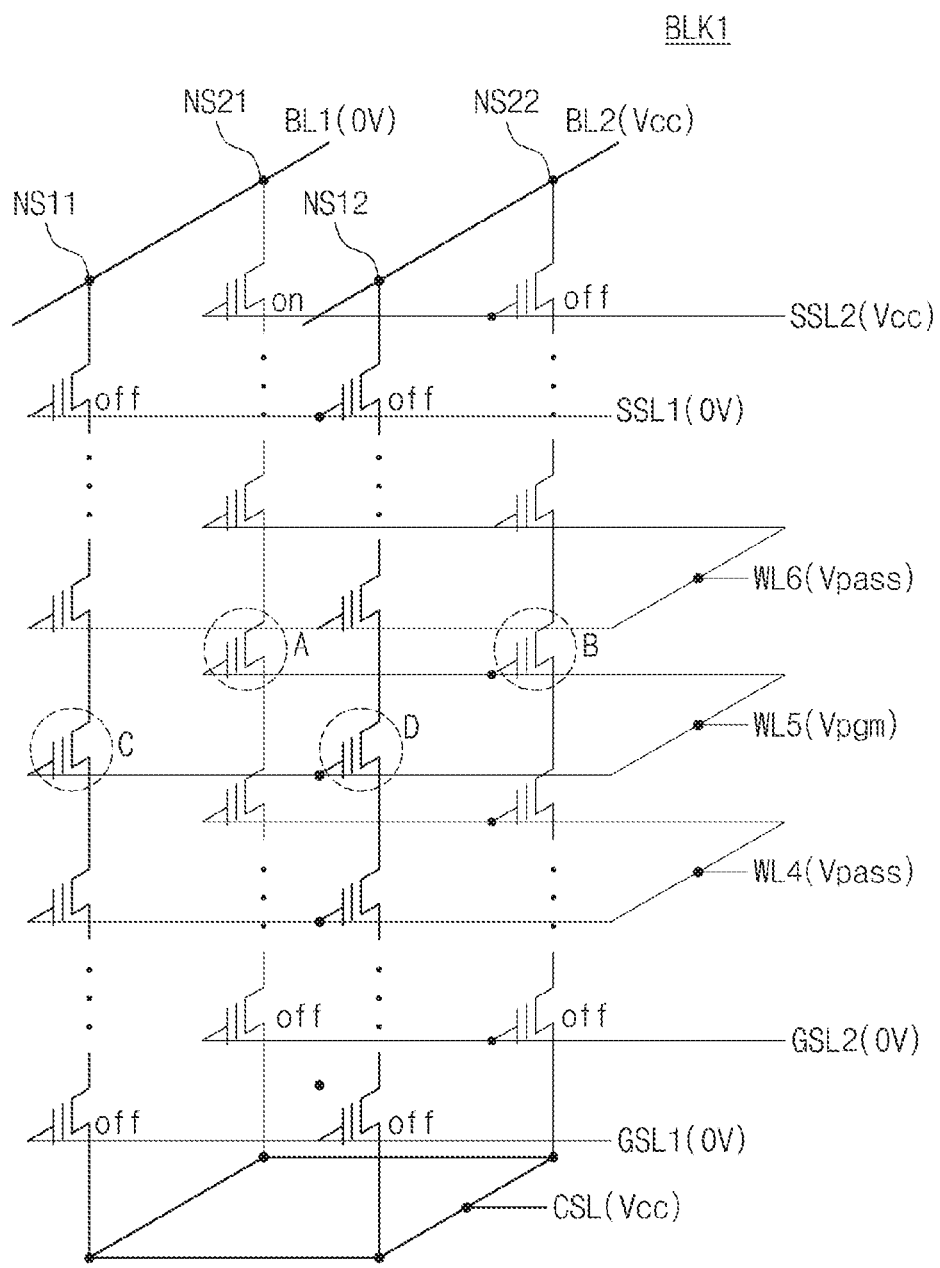
FIG. 5 is a circuit diagram illustrating a program bias condition of the three-dimensional flash memory illustrated in FIG. 4.

FIG. 5 is a circuit diagram illustrating a program bias condition of a three-dimensional flash memory illustrated in FIG. 4. FIG. 5 illustrates cell strings NS11 and NS21 connected to a first bit line BL1 and cell strings NS12 and NS22 connected to a second bit line BL2.

The first bit line BL1 may be a program bit line BLpgm to which a voltage of 0 V is applied, and the second bit line BL2 may be a program inhibit bit line BLinh to which a power supply voltage Vcc is applied. If the cell string NS21 among the cell strings NS11 and NS21 is selected, during a program operation, a voltage of 0 V may be applied to a first string selection line SSL1, and the power supply voltage Vcc may be applied to a second string selection line SSL2.

The voltage of 0 V may be applied to ground selection lines GSL1 and GSL2. Furthermore, a voltage (e.g., Vcc) higher than 0 V may be applied to a common source line CSL. A program voltage Vpgm (e.g., 18 V) may be applied to a selected word line (e.g., WL5) and a pass voltage Vpass (e.g., 8 V) may be applied to unselected word lines (e.g., WL4 and WL6).

Under the program bias condition, a voltage of 18 V may be applied to a gate of a memory cell A having a channel voltage of 0 V. Since a strong electric field is formed between the gate and a channel of the memory cell A, the memory cell A may be programmed. However, since respective channels of memory cells B, C and D are in a floating state, channel voltages thereof may be boosted up to Vb (e.g., 8 V), and thus, the memory cells B, C and D may not be programmed.

In FIG. 5, program inhibit cells B and D connected to the second bit line BL2 may have a channel boosting level the same as or similar to the cell string of a two-dimensional flash memory. That is, since the three-dimensional flash memory has a symmetrical voltage level on the basis of boosted channels of the program inhibit cells B and D during a program operation, an electric field difference may not almost exist between the boosted channel and the bit line BL2 or between the boosted channel and the common source line CSL.

However, the program inhibit cell C connected to the first bit line BL1 has an asymmetrical voltage level during the program operation. That is, during the program operation, a voltage of 0 V may be applied to the first bit line BL1, and the power supply voltage Vcc may be applied to the common source line CSL. Since the cell string NS11 has the asymmetrical voltage level on the basis of the boosted channel, an electric field difference may occur between the boosted channel and the first bit line BL1 or between the boosted channel and the common source line CSL. Due to this electric field difference, the cell string NS11 may suffer from excessive program disturbance in a specific direction (e.g., a GSL or SSL direction).

Figure 6:
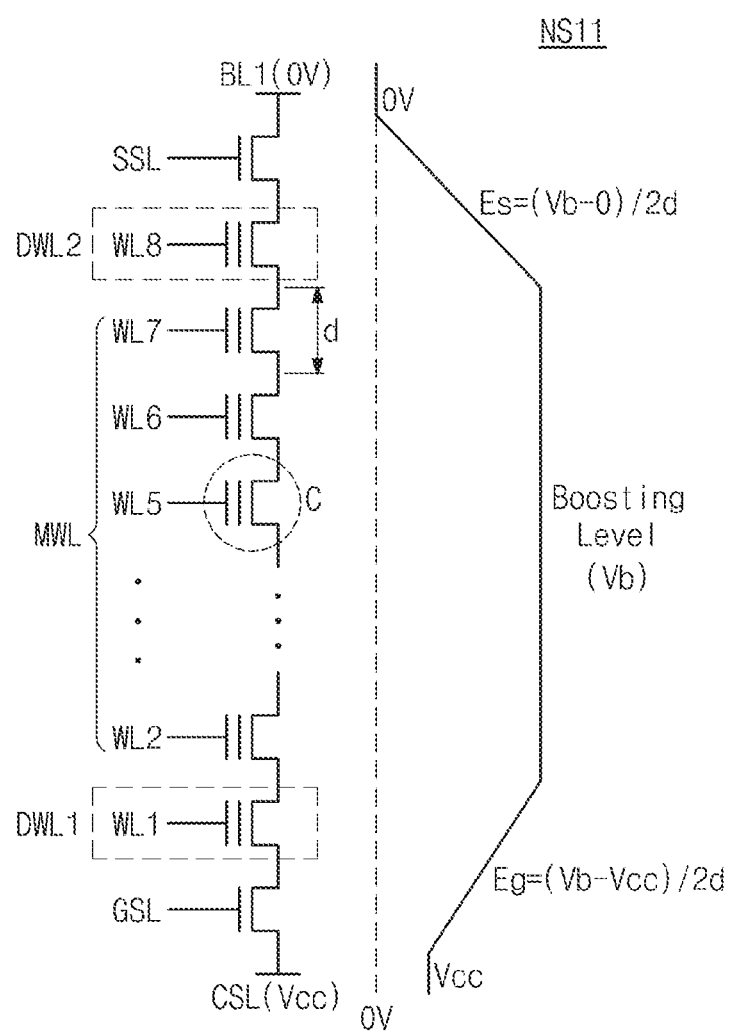
FIGS. 6 and 7 are diagrams illustrating a channel boosting level and electric fields in the direction of two selection lines of a cell string connected to a first bit line of FIG. 5.
Figure 7:
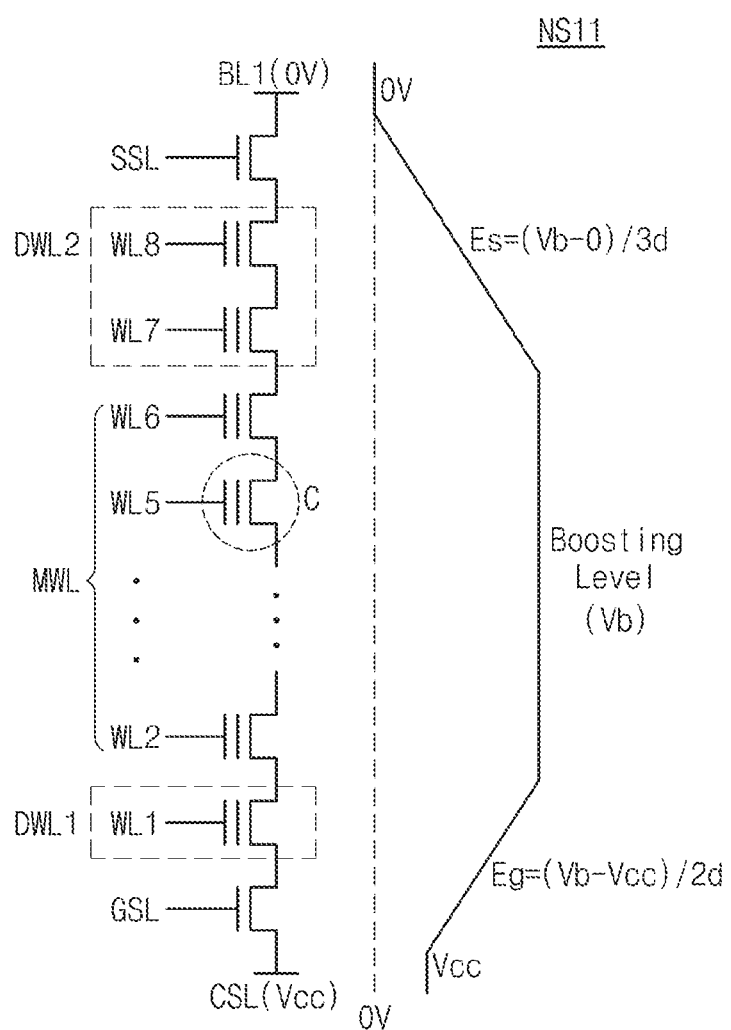

FIG. 6 and FIG. 7 are diagrams illustrating a channel boosting level of a cell string NS11 connected to a first bit line BL1 of FIG. 5 and electric fields Es and Eg in the direction of two selection lines. FIG. 6 exemplarily illustrates program disturbance in the case that the number of first dummy word lines DWL1 is the same as that of second dummy word lines DWL2, and FIG. 7 exemplarily illustrates program disturbance effects in the case that the number of first dummy word lines DWL1 is different from that of the second dummy word line DWL2.

Referring to FIG. 6, it is assumed that the first dummy word line DWL1 includes a first word line WL1, the second dummy word line DWL2 includes an eighth word line WL8, and the main word line MWL includes the second to seventh word lines WL2 to WL7. Furthermore, it is assumed that the program inhibit cell C is a memory cell connected to the fifth word line WL5.

During a program operation, a voltage of 0 V may be applied to the first bit line BL1, and a power supply voltage Vcc may be applied to the common source line CSL. Furthermore, when a program voltage Vpgm is applied to the selected word line WL5, a channel voltage may become a boosting level Vb.

If a length of a memory cell is "d", an electric field "Es" between the channel of the main word line MWL and the first bit line BL1 may be expressed as the following equation 1.

$$Es = \frac{Vb - 0}{2d} \quad \text{[Equation 1]}$$

Furthermore, an electric field Eg between the channel of the main word line MWL and the common source line CSL may be expressed as the following equation 2.

$$Eg = \frac{Vb - Vcc}{2d} \quad \text{[Equation 2]}$$

Referring to FIG. 6 and the equations 1 and 2, a difference between Es and Eg may be expressed as the following equation 3.

[Equation 3]

$$Es - Eg = \frac{Vb - 0}{2d} - \frac{Vb - Vcc}{2d} = \frac{Vcc}{2d} \quad \text{[Equation 3]}$$

Unlike the 2D flash memory, the above-described electric field difference of the 3D flash memory may occur in the case that a voltage of 0 V is applied to the first bit line BL1 connected to the program inhibit cell C. In other words, the above-described electric field difference may occur because the cell string NS11 having the program inhibit cell C is connected to the first bit line BL1. For this reason, the 3D flash memory may have an asymmetric voltage level on the basis of the boosted channel during a program operation, and thus, it may suffer from excessive program disturbances in a specific direction (in a GSL or SSL direction).

Referring to FIG. 7, the first dummy word line DWL1 may include the first word line WL1, the second dummy word line DWL2 may include seventh and eighth word lines WL7 and WL8, and the main word line MWL may include second to sixth word lines WL2 to WL6. In this case, an electric field Es between a channel of the main word line MWL and the first bit line BL1 may be expressed as the following equation 4.

$$Es = \frac{Vb - 0}{3d} \quad \text{[Equation 4]}$$

Furthermore, an electric field Eg between the channel of the main word line MWL and the common source line CSL may be expressed as the following equation 5.

$$Eg = \frac{Vb - Vcc}{2d} \quad \text{[Equation 5]}$$

Referring to FIG. 7 and the equations 4 and 5, a difference between Es and Eg may be expressed as the following equation 6.
[Equation 6]

$$Es - Eg = \frac{Vb - 0}{3d} - \frac{Vb - Vcc}{2d} = \frac{Vcc}{2d} - \frac{Vb}{6d} \quad \text{[Equation 6]}$$

It may be understood from the equations 3 and 6 that a difference between Es and Eg is reduced as much as Vb/6d when the number of first dummy word lines DWL1 is different from that of second dummy word lines DWL2.

The three-dimensional flash memory according to embodiments of the disclosure, as illustrated in FIG. 7, may be configured such that the number of first dummy word lines DWL1 is different from that of second dummy word lines DWL2, thereby reducing program disturbance due to an electric field difference. In other words, the three-dimensional flash memory according to an embodiment of the disclosure may have a structure in which upper and lower dummy word lines are asymmetric in number, thereby reducing program disturbance about an unselected cell string NS11.

Even though program disturbance occurring at a program operation is reduced through the above-described asymmetric structure of the upper and lower dummy word lines, read disturbance may still occur at a read operation. In detail, during a read operation of the 3D flash memory implemented with the asymmetric structure of the upper and lower dummy word lines, an imbalance of electric fields may exist because a pre-charge voltage (e.g., about 0.5 V) is applied to a bit line BL1 of the unselected string NS11 and a voltage of 0 V is applied to the common source line CSL.

The three-dimensional flash memory according to the disclosure may independently control voltages provided to the upper and lower dummy word lines to minimize the read disturbance during a read operation. This will be described in more detail with reference to the following FIG. 8 to FIG. 10.

Figure 8:
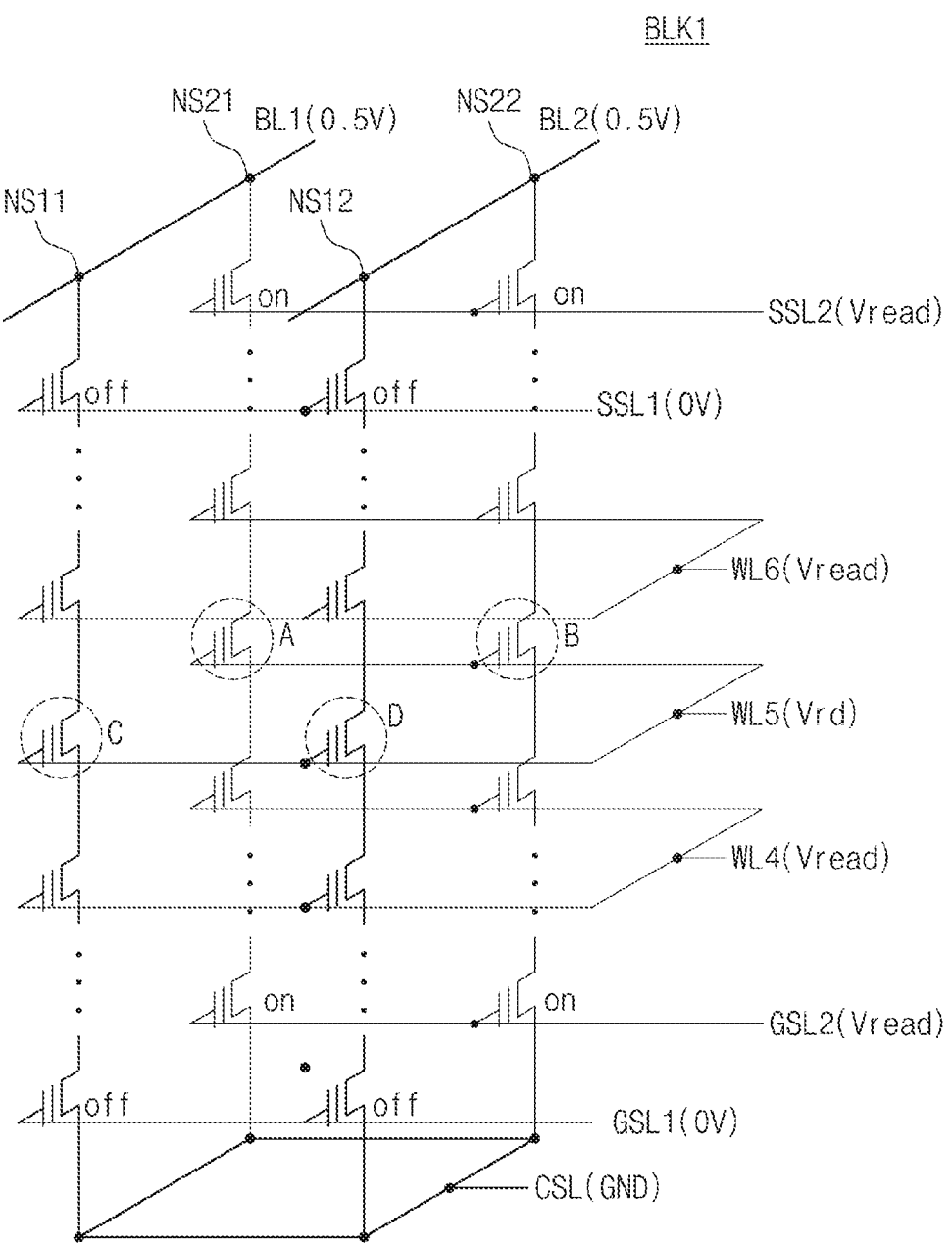
FIG. 8 is a circuit diagram illustrating a read bias condition of a three-dimensional flash memory described in FIG. 4.

FIG. 8 is a circuit diagram illustrating a read bias condition of a three-dimensional flash memory described in FIG. 4. For convenience of description, similarly to FIG. 5, cell strings NS11 and NS21 connected to a first bit line BL1 and cell strings NS12 and NS22 connected to a second bit line BL2 are illustrated in FIG. 8.

The first bit line BL1 and the second bit line BL2 may be pre-charged with a pre-charge voltage (e.g., 0.5 V). During a read operation, if cell strings NS21 and NS22 are selected, a voltage of 0 V may be applied to the first string selection line SSL1 and a non-selection read voltage Vread may be applied to the second string selection line SSL2. Furthermore, the voltage of 0 V may be applied to a first ground selection line GSL1 and the non-selection read voltage Vread may be applied to a second ground selection line GSL2. A selection read voltage Vrd may be applied to a selected word line (e.g., WL5) and the non-selection read voltage Vread (e.g., 8 V) may be applied to unselected word lines (e.g., WL4 and WL6).

In this read bias condition, a drain voltage and a source voltage of each of selected memory cells A and B may be 0.5 V and 0 V, respectively, and the selection read voltage Vrd may be applied to gates of the selected memory cells A and B. Furthermore, a read operation for verifying data stored at a memory cell may be performed while changing a voltage level of the selection read voltage Vrd.

In contrast, since channels of unselected memory cells C and D are floated, channel voltages thereof may rise up to a boosting level Vc. In this case, the unselected memory cells C and D may have an asymmetrical voltage during a read operation. That is, during the read operation, a voltage of 0.5V may be applied to the first and second bit lines BL1 and BL2 connected to the memory cells C and D, but a voltage of 0 V may be applied to the common source line CSL.

In this case, the cell strings NS11 and NS12 may have an asymmetrical voltage level on the basis of a boosted channel Vc, and thus, an electric field difference may occur between the boosted channel and the bit lines BL1 and BL2 or between the boosted channel and the common source line CSL. Due to this electric field difference, the cell strings NS11 and NS12 may excessively suffer from read disturbance in a specific direction (a GSL or SSL direction).

Figure 9:
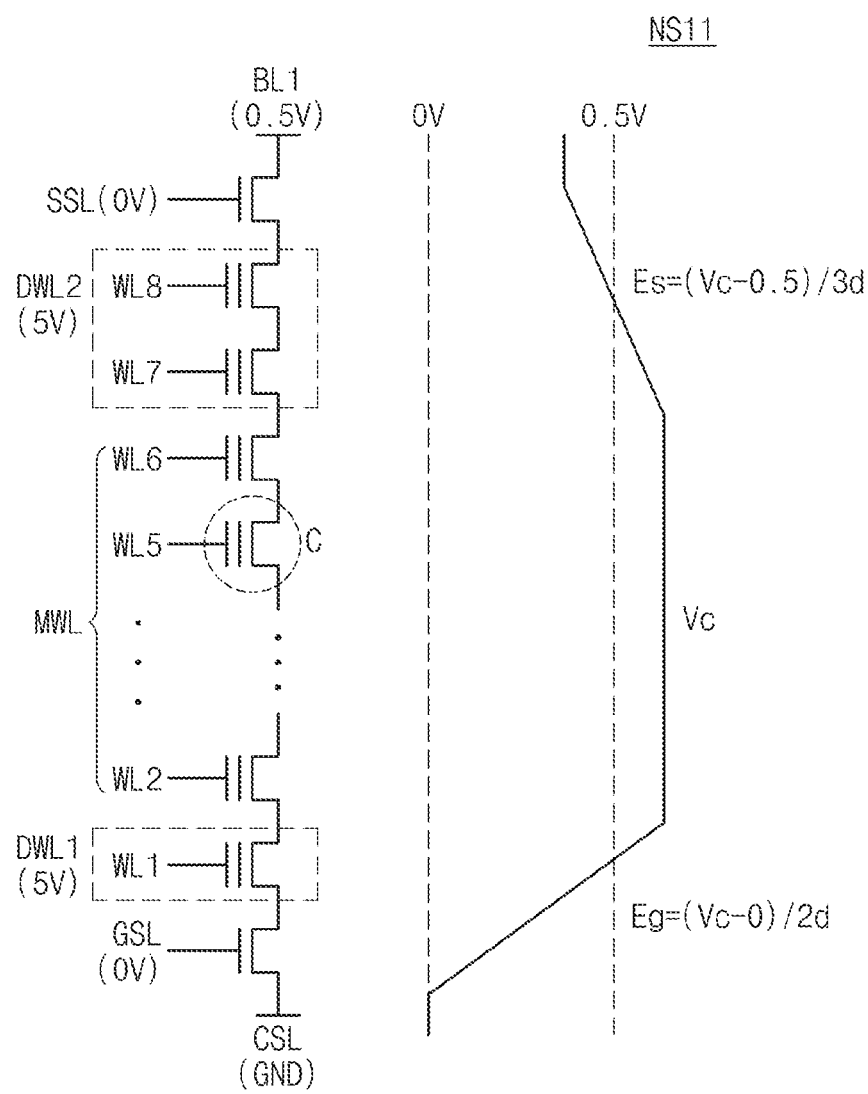
FIGS. 9 and 10 are diagrams illustrating a channel boosting level and electric fields in the direction of two selection lines of a cell string connected to the first bit line BL1 of FIG. 8.
Figure 10:
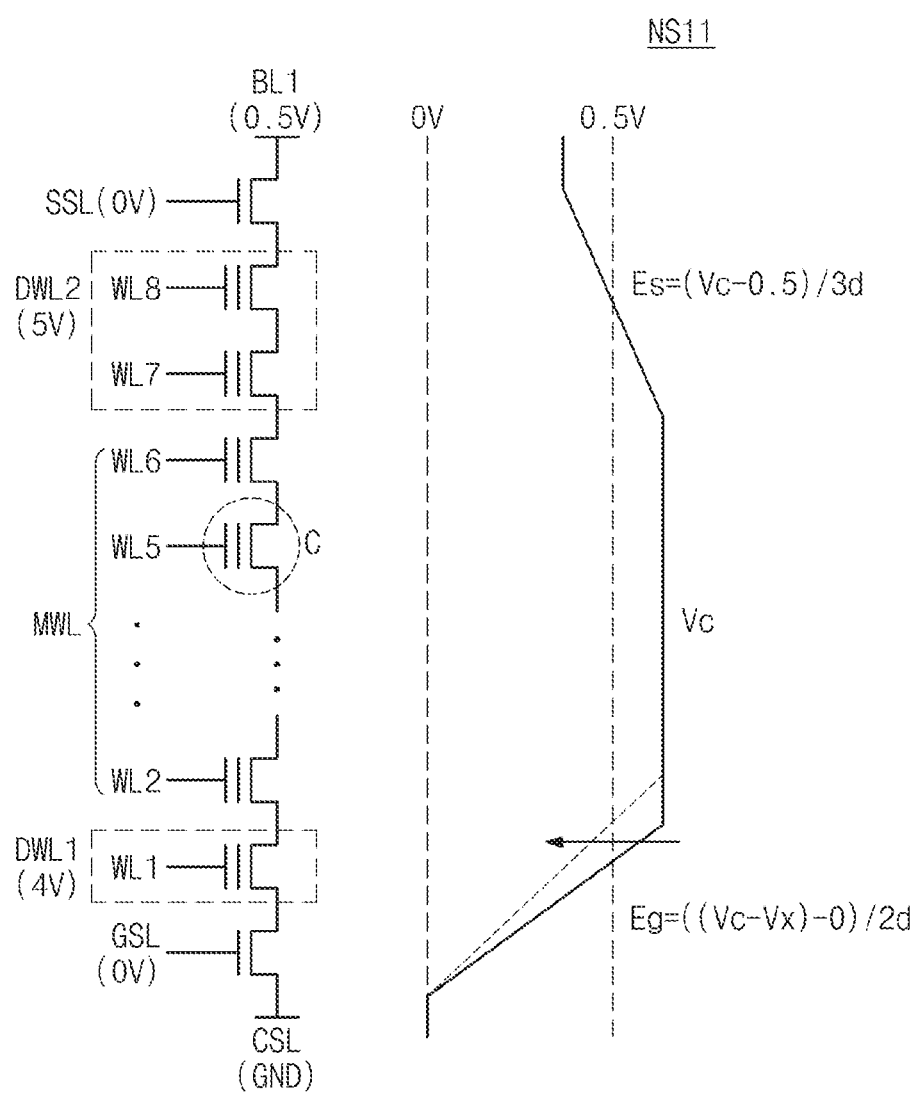

FIG. 9 and FIG. 10 are diagrams illustrating a channel boosting level of a cell string NS11 connected to a first bit line BL1 of FIG. 8 and electric fields Es and Eg in the direction of two selection lines. In FIGS. 9 and 10, the 3D flash memory may have a structure in which an upper dummy word line and a lower dummy word line are asymmetrical. FIG. 9 illustrates a read disturbance when the same dummy word line voltage is applied to the upper and lower dummy word lines, and FIG. 10 illustrates read disturbance when voltages of different levels are respectively applied to the upper and lower dummy word lines.

Referring to FIG. 9, it is assumed that a first dummy word line DWL1 includes a first word line WL1, a second dummy word line DWL2 includes seventh and eighth word lines WL7 and WL8, and a main word line MWL includes second to sixth word lines WL2 to WL6. Furthermore, it is assumed that a read operation is performed with respect to a memory cell C connected to a fifth word line WL5.

During a read operation, a voltage of 0.5 V may be applied to the first bit line BL1, a ground voltage (e.g., 0 V) may be applied to the common source line CSL, and a voltage of 5 V may be applied to each of the first and second dummy word lines DWL1 and DWL2. Furthermore, when a selection read voltage Vrd and a non-selection read voltage Vread are applied to a selected word line WL5 and unselected word lines WL2 to WL4 and WL6, a channel voltage may become a boosting level Vc.

If a length of a memory cell is "d", an electric field Es between the channel of the main word line MWL and the first bit line BL1 may be expressed as the following equation 7.

$$Es = \frac{(Vc - 0.5)}{3d} \quad \text{[Equation 7]}$$

Furthermore, an electric field Eg between the channel of the main word line MWL and the common source line CSL may be expressed as the following equation 8.

$$Eg = \frac{Vc - 0}{2d} \quad \text{[Equation 8]}$$

Referring to FIG. 9 and the equations 7 and 8, a difference between Es and Eg may be expressed as the following equation 9.
[Equation 9]

$$Eg - Es = \frac{Vc - 0}{2d} - \frac{(Vc - 0.5)}{3d} = \frac{Vc + 1}{6d} \quad \text{[Equation 9]}$$

As understood from the above description, read disturbance may still be problematic during a read operation even though upper and lower dummy word lines of the 3D flash memory are implemented in the asymmetric structure to reduce program disturbance. The reason is that 0.5 V and 0 V are respectively applied to the bit line BL and the common source line CSL during a read operation, and thus, a difference still exists between Es and Eg. Hence, the 3D flash memory may have asymmetric voltage levels on the basis of a boosted channel during a read operation, thereby causing a decrease in reliability of data due to read disturbance.

Unlike FIG. 9, referring to FIG. 10, different voltages may be applied to the first and second dummy word lines DWL1 and DWL2, respectively. That is, a voltage of 4 V may be applied to the first dummy line DWL1, and a voltage of 5 V may be applied to the second dummy word line DWL2. In this case, an electric field Es between the channel of the main word line MWL and the first bit line BL1 may be expressed as the following equation 10.

$$Es = \frac{(Vc - 0.5)}{3d} \quad \text{[Equation 10]}$$

Furthermore, an electric field Eg between the channel of the main word line MWL and the common source line CSL may be expressed as the following equation 11.

$$Eg = \frac{(Vc - Vx) - 0}{2d} \quad \text{[Equation 11]}$$

In the equation 11, "Vx" may mean a voltage drop generated when a voltage applied to the first dummy word line DWL1 is lower than a voltage applied to the second dummy word line DWL2.

Referring to FIG. 10 and the equations 10 and 11, a difference between Es and Eg may be expressed as the following equation 12.
[Equation 12]

$$Eg - Es = \frac{(Vc - Vx) - 0}{2d} - \frac{(Vc - 0.5)}{3d} = \frac{Vc + 1}{6d} - \frac{Vx}{2d} \quad \text{[Equation 12]}$$

As understood from the equations 9 and 12, a difference (Eg−Es) between Es and Eg may be reduced as much as Vx/2d when a difference between voltages applied to the first and second dummy word lines DWL1 and DWL2 is set differently.

Thus, the three-dimensional flash memory according to embodiments of the disclosure, as illustrated in FIG. 10, may set voltages applied to the first and second dummy word lines DWL1 and DWL2 to be different, thereby reducing read disturbance due to an electric field difference.

Meanwhile, a difference between a voltage applied to the first dummy word line DWL1 and a voltage applied to the second dummy word line DWL2 may be variously adjusted.

For example, a difference between voltages applied to the first and second dummy word lines DWL1 and DWL2 may be adjusted according to an external temperature. Specifically, the difference (Eg-Es) between Es and Eg may be increased as the external temperature becomes higher (or lower). In this case, the difference between the voltages applied to the first and second dummy word lines DWL1 and DWL2 may be set to be greater, thereby minimizing the difference (Eg-Es) between Es and Eg.

Alternatively, the difference between the voltages applied to the first and second dummy word lines DWL1 and DWL2 may be differently set in light of a program/erase cycle, that is, the number of events that a program operation and an erase operation are performed. Specifically, for example, for a memory block in which a lot of (or few) erase operations are performed, the difference (Eg-Es) between Es and Eg may become great. In this case, the difference between the voltages applied to the first and second dummy word lines DWL1 and DWL2 may be adjusted to be great, thereby minimizing the difference (Eg-Es) between Es and Eg.

As another embodiment, the voltage difference may be differently set according to a read mode, that is, whether a memory cell is a single level cell (SLC) in which 1-bit data is stored or a multi-level cell (MLC) in which multi-bit data is stored.

In addition, the voltage difference may be differently set according to a position of a memory block in which a read operation is performed. For example, due to a manufacturing process or use policy about memory blocks, the difference (Eg-Es) between Es and Eg of a memory block at a predefined position may be greater than that of a memory block at another position. Alternatively, in the case that data stored in the memory block at the predefined position is important data, the reliability of data of the memory block needs to be improved. In this case, the difference between the voltages applied to the first and second dummy word lines DWL1 and DWL2 may be precisely adjusted, thereby minimizing the difference (Eg-Es) between Es and Eg.

In FIGS. 3 to 10, an embodiment of the disclosure is exemplified in which the upper dummy word line and the lower dummy word line are asymmetric in terms of the number of word lines appointed as a dummy word line. However, the scope of the disclosure may not be limited thereto. For example, the upper dummy word line and the lower dummy word line may be formed to have an asymmetrical structure in terms of a distance between a dummy word line and a selection line (SSL or GSL), a width of the dummy word line, and the like. This will be described in more detail with reference to FIGS. 11 to 16.

In FIGS. 3 to 10, to describe program distance and a structure for reducing the program disturbance, an embodiment of the disclosure is exemplified in which the number of word lines included in an upper word line is more than that included in a lower word line. However, the scope of the disclosure may not be limited thereto. For example, the number of word lines included in a dummy word line and an asymmetric relationship thereof may be variously changed according to a cell characteristic of the memory block, a voltage level provided to a selection line GSL and SSL, a bit line BL, or the like. This will be described in more detail with reference to FIGS. 11 to 16.

FIGS. 11 to 16 are diagrams schematically illustrating a word line structure of a three-dimensional flash memory according to embodiments of the disclosure. Shaded word lines may be dummy word lines DWL, and the remaining word lines may be main word lines MWL.

Figure 11:
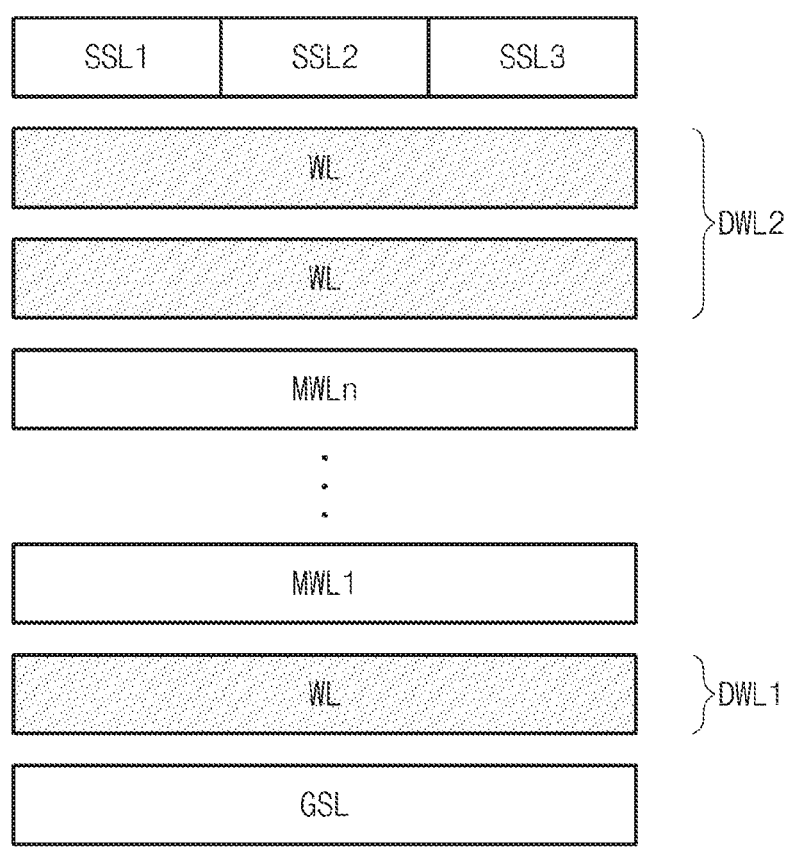
FIGS. 11 to 16 are conceptual views illustrating a word line structure of a three-dimensional flash memory according to embodiments of the disclosure.

FIG. 11 schematically illustrates a three-dimensional flash memory in which the number of word lines included in an upper dummy word line is more than that included in a lower dummy word line. Referring to FIG. 11, a first dummy word line DWL1 including one word line may be disposed between a ground selection line GSL and a first main word line MWL1, and a second dummy word line DWL2 including two word lines may be disposed between string selection lines SSL1 to SSL3 and an n-th main word line MWLn. As described above, according to embodiments of the disclosure, the number of dummy word lines adjacent to a string selection line SSL may be different from that adjacent to a ground selection line GSL, thereby reducing an electric field difference and program disturbance in a specific direction.

According to embodiments of the disclosure, to reduce read disturbance at a read operation, levels of voltages provided to the first and second dummy word lines DWL1 and DWL2 may be different from each other. In this case, as described with reference to FIG. 10, a level of voltage applied to the second dummy word line DWL2 may be higher than that applied to the first dummy word line DWL1.

In contrast, during a read operation, a level of a voltage applied to the first dummy word line DWL1 may be higher than that applied to the second dummy word line DWL2. For example, in the process of forming a three-dimensional flash memory, memory cells may be formed such that the electric field Es is greater than the electric field Eg. In this case, a level of a voltage applied to the first dummy word line DWL1 may be set to be higher than that applied to the second dummy word line DWL2, thereby reducing a difference between the electric fields Es and Eg. This may mean that the read disturbance is minimized.

Figure 12:
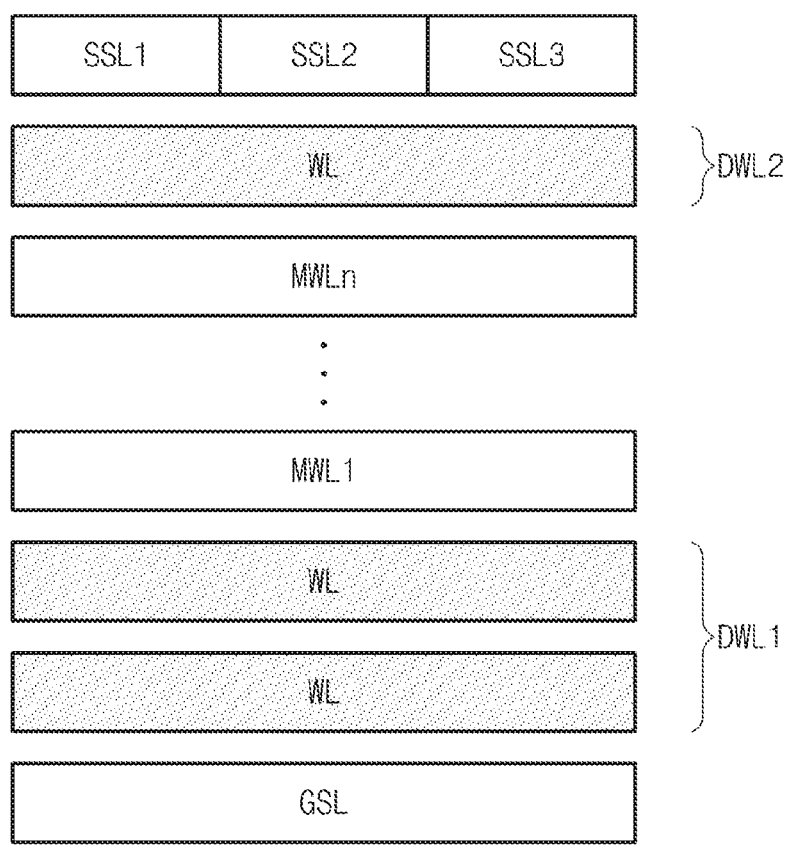

FIG. 12 schematically illustrates a three-dimensional flash memory in which the number of word lines included in a lower dummy word line is more than that included in an upper dummy word line. Referring to FIG. 12, a first dummy word line DWL1 including two word lines may be disposed between a ground selection line GSL and a first main word line MWL1, and a second dummy word line DWL2 including one word line may be disposed between string selection lines SSL1 to SSL3 and an n-th main word line MWLn. For example, in the process of forming a three-dimensional flash memory, in the case that an error rate of data stored to a memory cell increases as a distance from a substrate becomes shorter, the three-dimensional flash memory may be implemented such that the number of word lines included in the first dummy word line DWL1 is more than that included in the second dummy word line DWL2.

In this case, to minimize read disturbance, a level of a voltage applied to the first dummy word line DWL1 and a level of a voltage applied to the second dummy word line DWL2 may be set to be different from each other. For example, when the electric field Es is greater than the electric field Eg, the three-dimensional flash memory may perform control such that the level of the voltage applied to the first dummy word line DWL1 is higher than that of the voltage applied to the second dummy word line DWL2, thereby reducing a difference between the electric fields Es and Eg. This may mean that the read disturbance is minimized. In contrast, when the electric field Eg is greater than the electric field Es, the three-dimensional flash memory may perform control such that the level of the voltage applied to the second dummy word line DWL2 is higher than that of the voltage applied to the first dummy word line DWL1.

Figure 13:
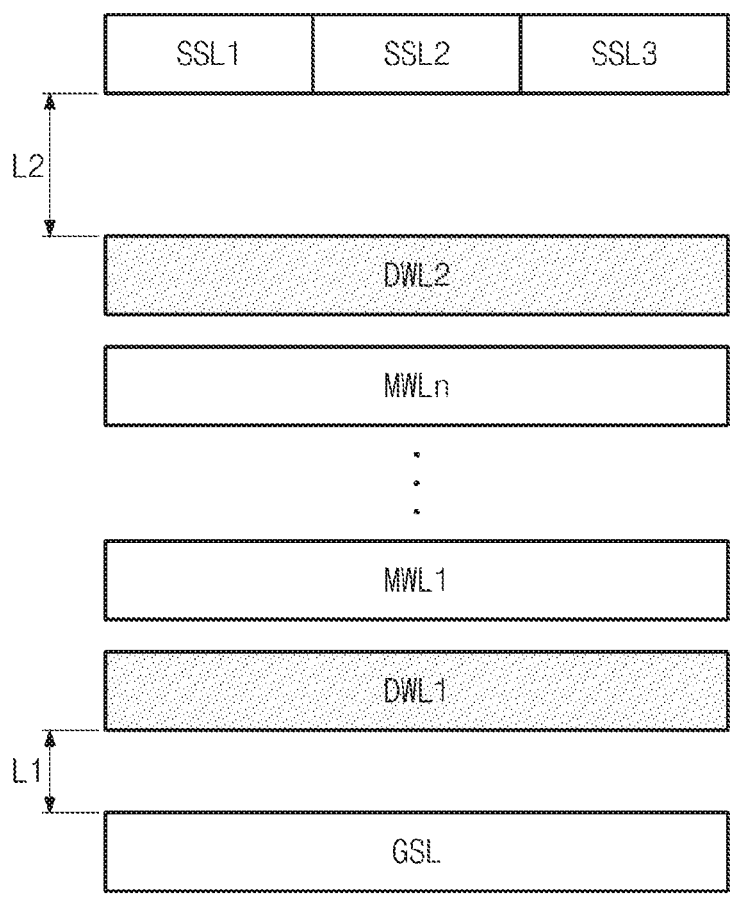

FIG. 13 schematically illustrates a three-dimensional flash memory implemented such that a distance (or space) between an upper dummy word line and a string selection line SSL is physically longer than a distance (or space) between a lower dummy word line and a ground selection line GSL. Referring to FIG. 13, a distance (or length) between the ground selection line GSL and a first dummy word line DWL1 may be "L1", and a distance (or length) between the string selection line SSL and a second dummy word line DWL2 may be "L2". In FIG. 13, an embodiment of the disclosure is exemplified in which "L2" is greater than "L1". For example, to minimize program disturbance, as illustrated in FIG. 13, the three-dimensional flash memory may be formed to have a physical characteristic that "L2" is greater than "L1".

In this case, to minimize read disturbance, levels of voltages applied to the first and second dummy word lines DWL1 and DWL2 may be variously set. For example, when the electric field Es is greater than the electric field Eg, the three-dimensional flash memory may perform control such that the level of the voltage applied to the first dummy word line DWL1 is higher than that of the voltage applied to the second dummy word line DWL2. In contrast, when the electric field Eg is greater than the electric field Es, the three-dimensional flash memory may perform control such that the level of the voltage applied to the second dummy word line DWL2 is higher than that of the voltage applied to the first dummy word line DWL1.

Figure 14:
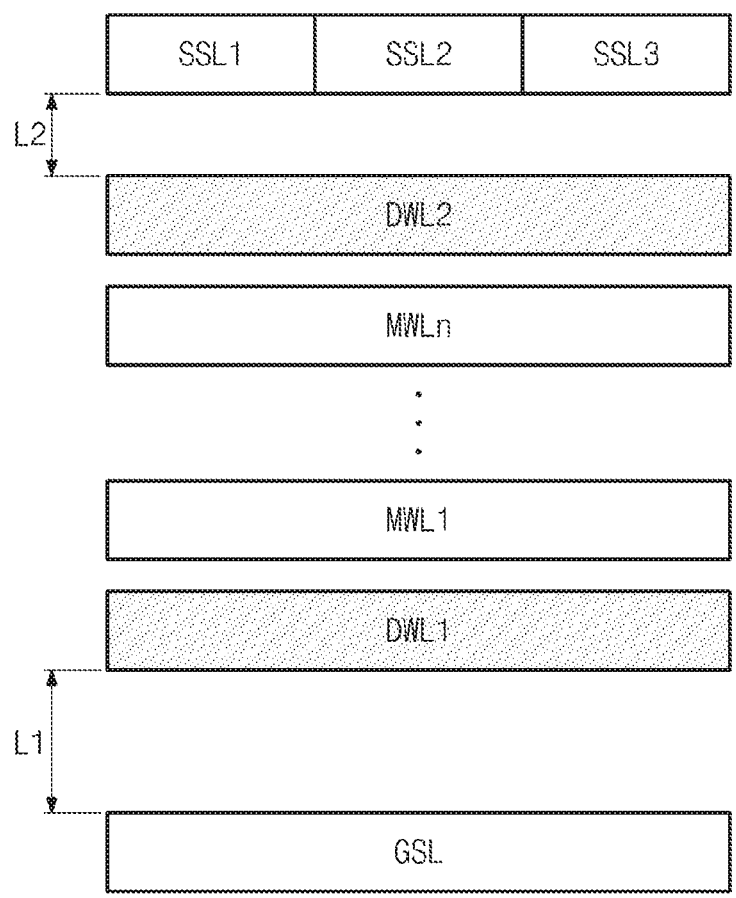

FIG. 14 schematically illustrates a three-dimensional flash memory implemented such that a distance or space between a lower dummy word line and a ground selection line GSL is physically greater than a distance or space between an upper dummy word line and a string selection line SSL. Referring to FIG. 14, a length (or distance) between the ground selection line GSL and a first dummy word line DWL1 may be "L1", and a length (or distance) between the string selection line SSL and a second dummy word line DWL2 may be "L2". In FIG. 14, an embodiment of the disclosure is exemplified in which "L1" is longer than "L2". For example, to protect data stored at memory cells of a first main word line MWL1, the three-dimensional flash memory may be formed to have a physical characteristic in which "L1" is longer than "L2" as illustrated in FIG. 14.

In this case, to minimize read disturbance, levels of voltages applied to the first and second dummy word lines DWL1 and DWL2 may be variously set. For example, when the electric field Es is greater than the electric field Eg, the three-dimensional flash memory may perform control such that the level of the voltage applied to the first dummy word line DWL1 is higher than that of the voltage applied to the second dummy word line DWL2. In contrast, when the electric field Eg is greater than the electric field Es, the three-dimensional flash memory may perform control such that the level of the voltage applied to the second dummy word line DWL2 is higher than that of the voltage applied to the first dummy word line DWL1.

Figure 15:
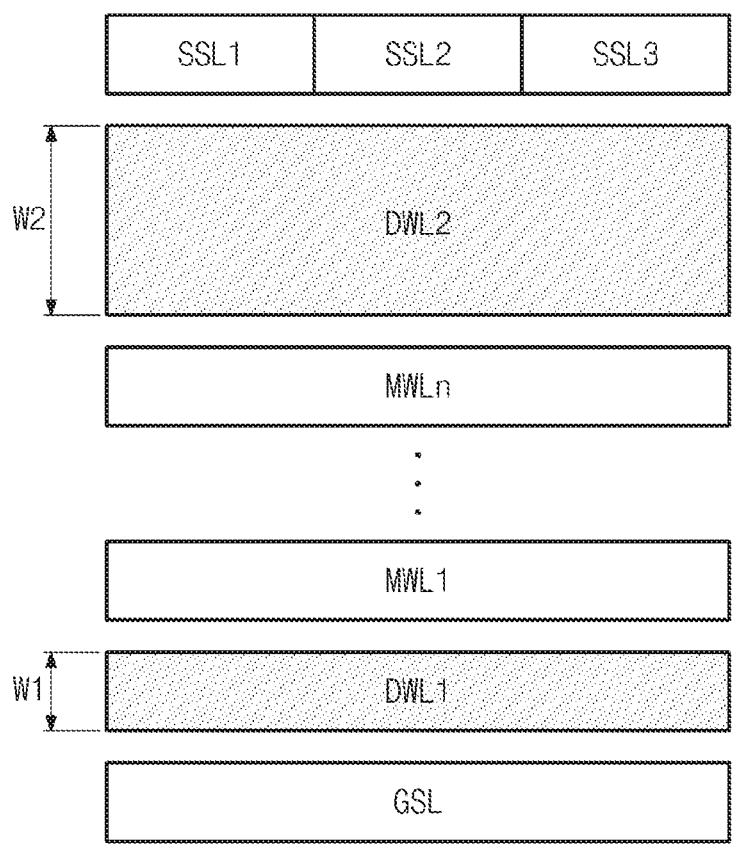

FIG. 15 schematically illustrates a three-dimensional flash memory implemented such that a width of a second dummy word line is physically greater than a width of a first dummy word line. Referring to FIG. 15, a width of a first dummy word line DWL1 may be "W1", and a width of a second dummy word line DWL2 may be "W2". In FIG. 15, an embodiment of the disclosure is exemplified in which "W2" is greater than "W1". For example, to minimize the program disturbance, the three-dimensional flash memory may be formed to have a physical characteristic in which "W2" is greater than "W1" as illustrated in FIG. 15.

In this case, to minimize read disturbance, levels of voltages applied to the first and second dummy word lines DWL1 and DWL2 may be variously set. For example, when the electric field Es is greater than the electric field Eg, the three-dimensional flash memory may perform control such that a level of a voltage applied to the first dummy word line DWL1 is higher than that applied to the second dummy word line DWL2. In contrast, when the electric field Eg is greater than the electric field Es, the three-dimensional flash memory may perform control such that the level of the voltage applied to the second dummy word line DWL2 is higher than that applied to the first dummy word line DWL1.

Figure 16:
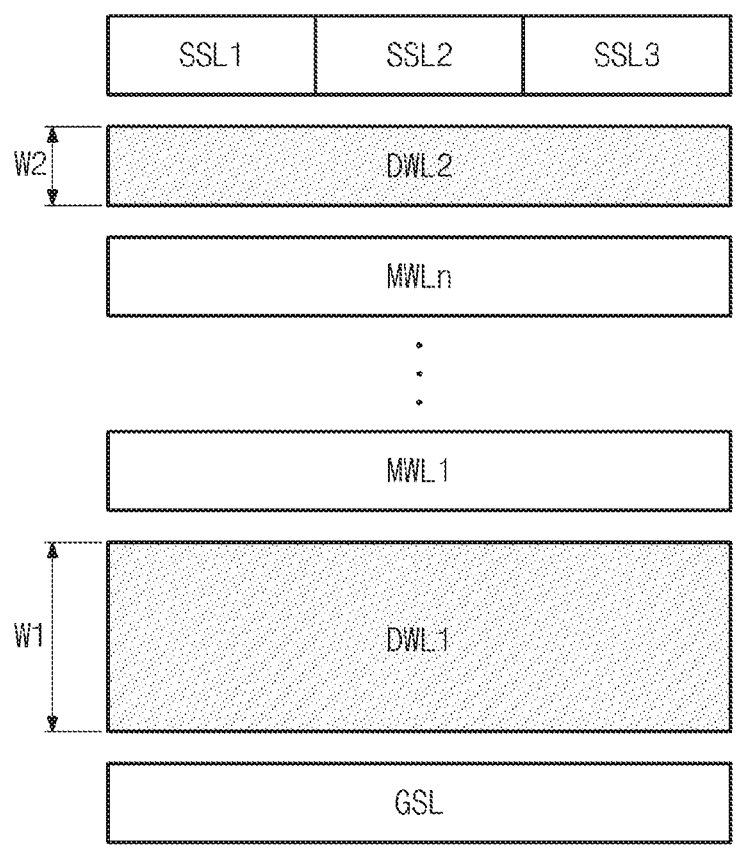

FIG. 16 schematically illustrates a three-dimensional flash memory implemented such that a width of a first dummy word line is physically greater than a width of a second dummy word line. Referring to FIG. 16, a width of a first dummy word line DWL1 may be "W1", and a width of a second dummy word line DWL2 may be "W2". In FIG. 15, an embodiment of the disclosure is exemplified in which "W2" is greater than "W1". In FIG. 16, an embodiment of the disclosure is exemplified in which "W1" is greater than "W2". For example, to protect data stored to memory cells of a first main word line MWL1, the three-dimensional flash memory may be formed to have a physical characteristic in which "W1" is greater than "W2" as illustrated in FIG. 16.

In this case, to minimize read disturbance, levels of voltages applied to the first and second dummy word lines DWL1 and DWL2 may be variously set. For example, when the electric field Es is greater than the electric field Eg, the three-dimensional flash memory may perform control such that a level of a voltage applied to the first dummy word line DWL1 is higher than that applied to the second dummy word line DWL2. In contrast, when the electric field Eg is greater than the electric field Es, the three-dimensional flash memory may control such that the level of the voltage applied to the second dummy word line DWL2 is higher than that of the voltage applied to the first dummy word line DWL1.

A data storage device in accordance with embodiments of the disclosure may be applied to various types of products or applications. The data storage device may be implemented with not only electronic devices such as a personal computer, a digital camera, a camcorder, a cellular phone, an MP3, a PMP, a PSP, a PDA, and the like but also storage devices such as a memory card, a USB memory, a solid state drive (SSD), and the like.

Figure 17:
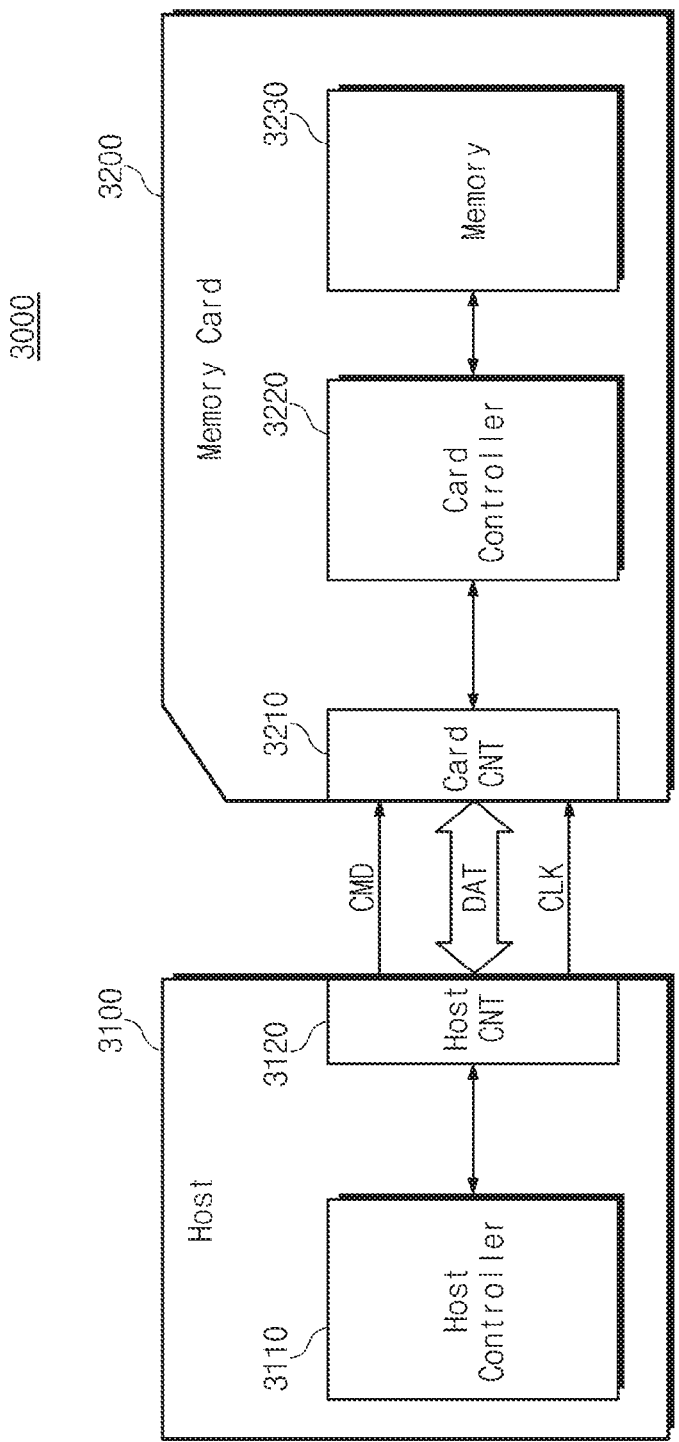
FIG. 17 is a block diagram illustrating a memory card including a data storage device according to embodiments of the disclosure.

FIG. 17 is a block diagram illustrating a memory card including a data storage device according to embodiments of the disclosure. A memory card system 3000 may include a host 3100 and a memory card 3200. The host 3100 may include a host controller 3110 and a host connection unit 3120. The memory card 3200 may include a card connection unit 3210, a card controller 3220 and a flash memory 3230. In this case, the flash memory 3230 may be implemented with the three-dimensional flash memory described above.

The host 3100 may write data in the memory card 3200 or may read data stored in the memory card 3200. The host controller 3110 may transmit a command CMD (e.g., a write command), a clock signal CLK generated from a clock generator in the host 3100 and data DAT to the memory card 3200 via the host connection unit 3120.

The card controller 3220 may store data in the flash memory 3230 in response to a write command received via the card connection unit 3210, and in particular, data may be stored in synchronization with a clock signal CLK generated from a clock generator (not illustrated) in the card controller 3220. The flash memory 3230 may store data transmitted from the host 3100. In the case that the host 3100 is a digital camera, the flash memory may store image data.

Figure 18:
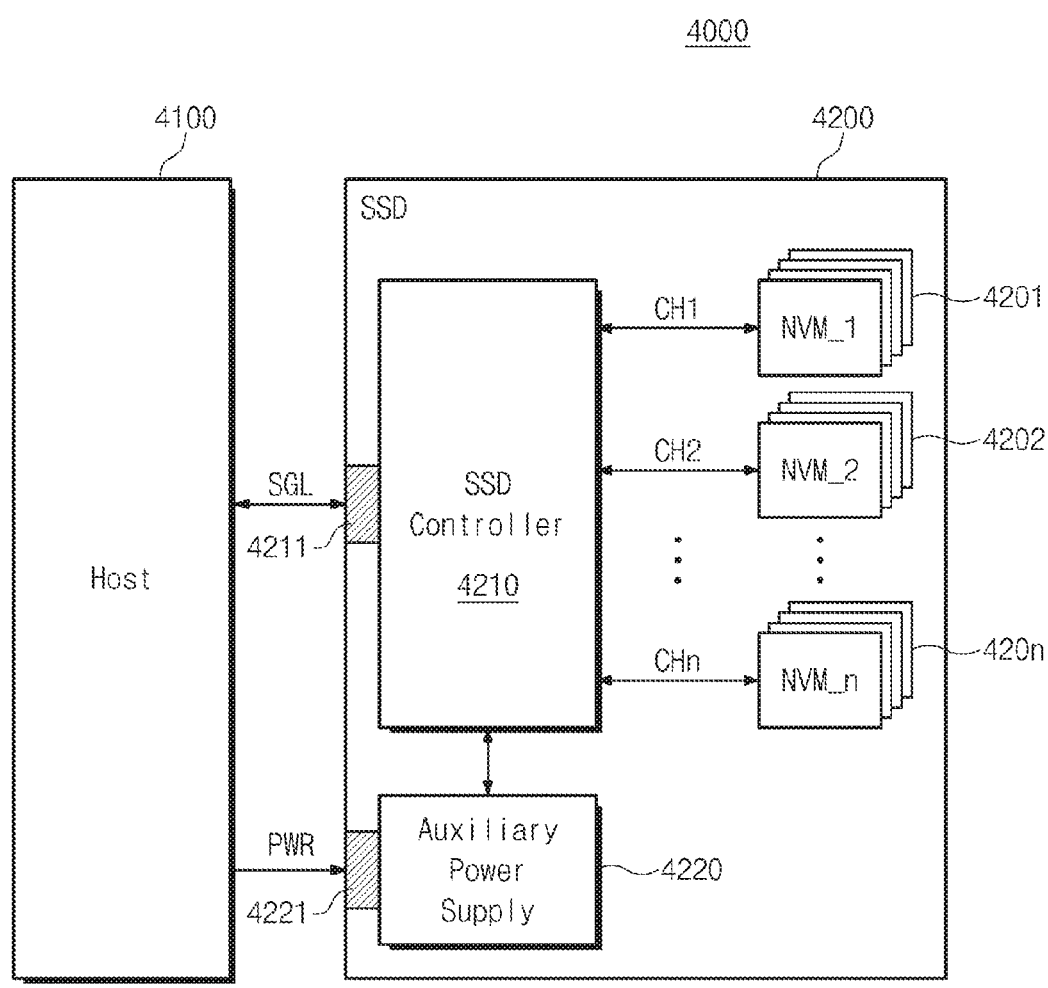
FIG. 18 is a block diagram illustrating a solid state drive (SSD) including a data storage device in accordance with embodiments of the disclosure.

FIG. 18 is a block diagram illustrating a solid state drive (SSD) including a data storage device in accordance with embodiments of the disclosure. Referring to FIG. 18, a SSD system 4000 may include a host 4100 and a SSD 4200.

The SSD 4200 may exchange a signal with the host 4100 via a signal connector 4211 and may receive power via a power connector 4221. The SSD 4200 may include a plurality of flash memories 4201 to 420n, an SSD controller 4210 and an auxiliary power supply 4220.

The flash memories 4201 to 420n may be used as a storage medium of the SSD 4200. As well as the flash memory, nonvolatile memory devices such as a PRAM, a MRAM, a ReRAM, a FRAM, and the like may be used as a storage medium of the SSD 4200. The flash memories 4201 to 420n may be connected to the SSD controller 4210 via a plurality of channels CH1 to CHn. One or more flash memories may be connected to a channel. Flash memories connected to a channel may be connected to the same data bus.

The SSD controller 4210 may exchange a signal SGL with the host 4100 via the signal connector 4211. The signal SGL may include a command, an address, data, and the like. The SSD controller 4210 may write data at a corresponding flash memory or may read data therefrom based on a command of the host 4100. An internal configuration of the SSD controller 4210 will be described in detail with reference to FIG. 19

The auxiliary power supply 4220 may be connected to the host 4100 via the power connector 4221. The auxiliary power supply 4220 may receive the power PWR from the host 4100 and may be charged with the received power PWR. The auxiliary power supply 4220 may be located inside or outside the SSD 4200.

For example, the auxiliary power supply 4220 may be located on a main board and may provide auxiliary power to the SSD 4200.

Figure 19:
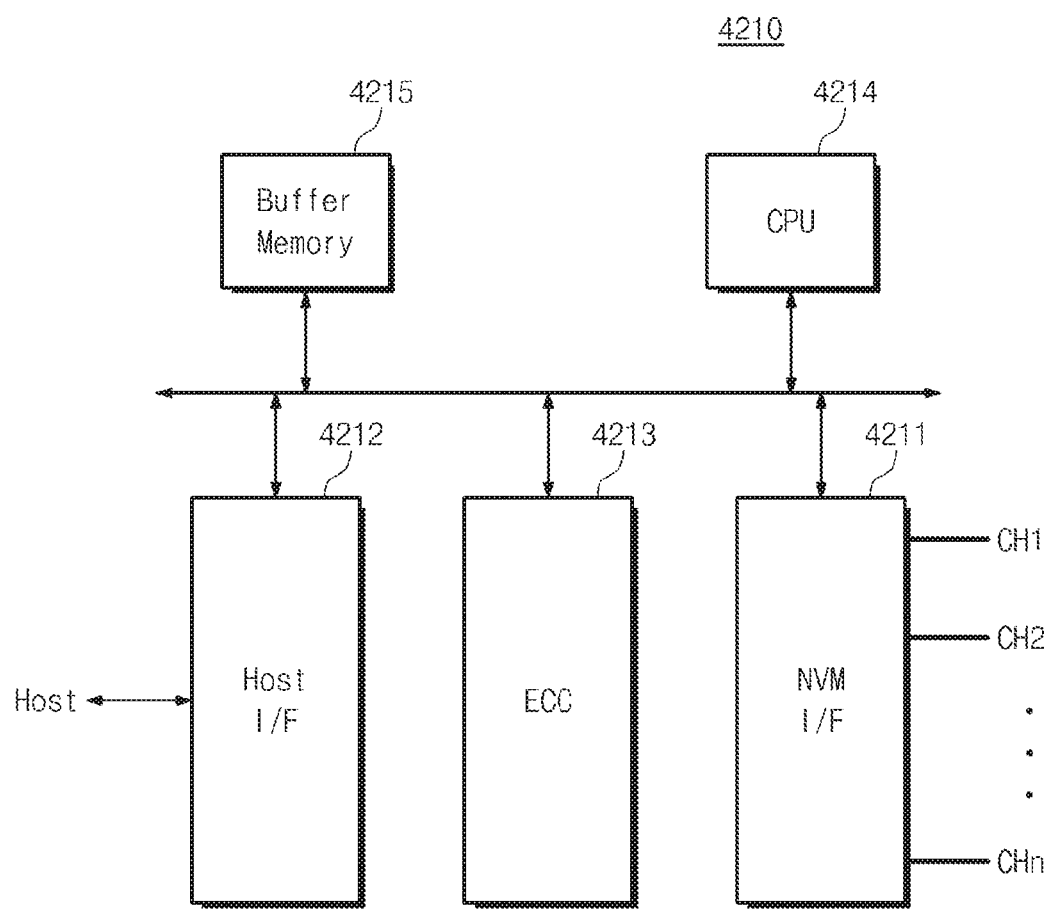
FIG. 19 is a block diagram illustrating an SSD controller illustrated in FIG. 18.

FIG. 19 is a block diagram illustrating an SSD controller 4210 illustrated in FIG. 18. Referring to FIG. 19, an SSD controller 4210 may include an NVM interface 4211, a host interface 4212, an ECC circuit 4213, a central processing unit (CPU) 4214 and a buffer memory 4215.

The NVM interface 4211 may distribute data transmitted from the buffer memory 4215 to channels CH1 to CHn. Furthermore, the NVM interface 4211 may transmit data read from the flash memories 4201 to 420n to the buffer memory 4215. In this case, the NVM interface 4211 may use an interface method of the flash memory. That is, the SSD controller 4210 may perform a program, read or erase operation in a flash memory interface method.

The host interface 4212 may correspond to a protocol of the host 4100 for interfacing with the SSD 4200. The host interface 4212 may communicate with the host 4100 using a universal serial bus (USB), a small computer small interface (SCSI), a PCI express, an ATA, a parallel ATA (PATA), a serial ATA (SATA), a serial attached SCSI (SAS), and the like. Furthermore, the host interface 4212 may perform a function of a disk emulation which allows the host 4100 to recognize the SSD 4200 as a hard disk drive (HDD).

The ECC circuit 4213 may generate an error correction code ECC using data being transmitted to the flash memories 4201 to 420n. The generated error correction code ECC may be stored in a spare area of the flash memories 4201 to 420n. The ECC circuit 4213 may detect an error of data read from the flash memories 4201 to 420n. If the detected error is correctable, the ECC circuit 4213 may correct the detected error.

The CPU 4214 may analyze and process a signal SGL received from the host 4100 (refer to FIG. 17). The CPU 4214 may control the host 4100 or the flash memories 4201 to 420n via the host interface 4212 or the NVM interface 4211. The CPU 4214 may control the flash memories 4201 to 420n based on firmware for driving the SSD 4200.

The buffer memory 4215 may temporarily store write data provided from the host 4100 or data read from the flash memories 4201 to 420n. The buffer memory 4215 may store metadata or cache data to be stored in the flash memories 4201 to 420n. At a sudden power-off operation, the metadata or cache data stored in the buffer memory 4215 may be stored in the flash memories 4201 to 420n. The buffer memory 4215 may include a DRAM, a SRAM, and the like.

Figure 20:
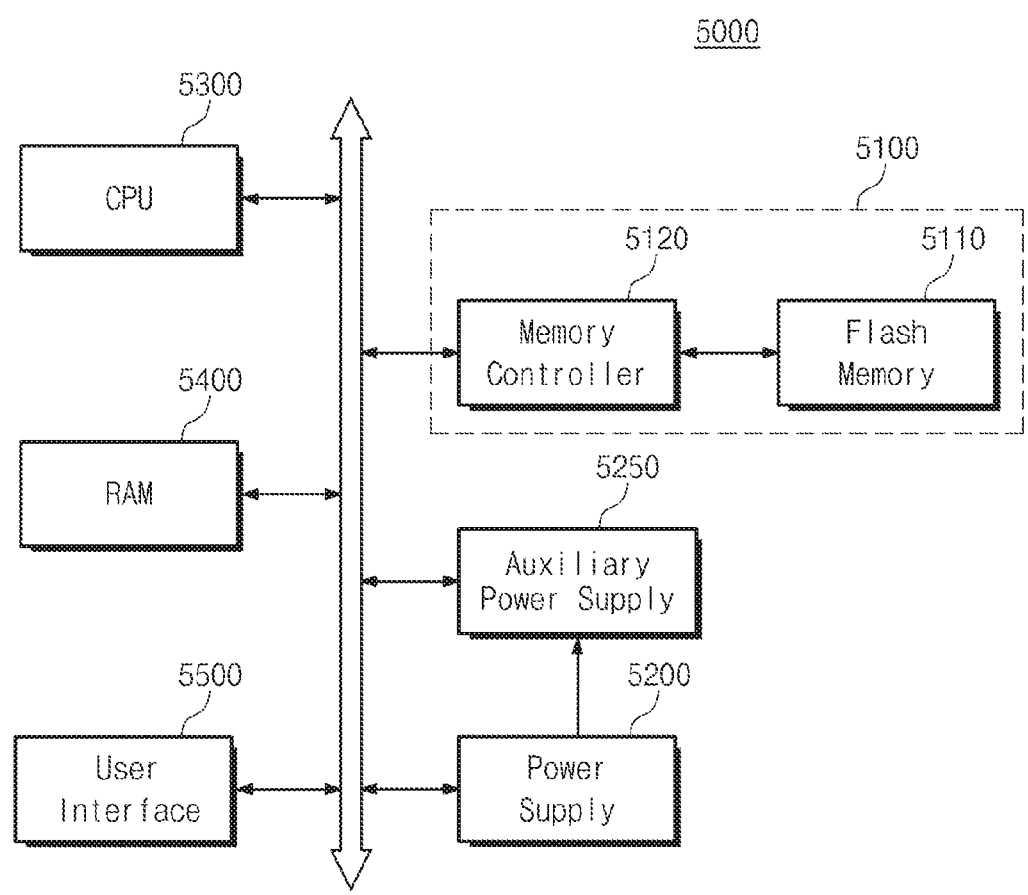
FIG. 20 is a block diagram illustrating an electronic device including a data storage device according to embodiments of the disclosure.

FIG. 20 is a block diagram illustrating an electronic device including a data storage device according to embodiments of the disclosure. In FIG. 20, an electronic device 5000 may be implemented with a personal computer (PC) or a portable electronic device such as a notebook computer, a cellular phone, a personal digital assistant (PDA), a camera, and the like.

Referring to FIG. 20, the electronic device 5000 may include a memory system 5100, a power supply 5200, an auxiliary power supply 5250, a CPU 5300, a RAM 5400 and a user interface 5500. The memory system 5100 may include a flash memory 5110 and a memory controller 5120.

A three-dimensional flash memory according to embodiments of the disclosure may have a structure in which an upper dummy word line and a lower dummy word line are asymmetric, thereby reducing program disturbance. This may mean that data reliability is improved. Furthermore, the three-dimensional flash memory according to embodiments of the disclosure may be implemented such that voltages of different levels are applied to the upper and lower dummy word lines formed asymmetrically, thereby reducing read disturbance. This may mean that data reliability is more improved.

While the disclosure has been described with reference to exemplary embodiments, it will be apparent to those skilled in the art that various changes and modifications may be made without departing from the scope of the disclosure. Therefore, it should be understood that the above embodiments are not limiting, but illustrative.

What is claimed is:

1. A three-dimensional flash memory device which includes a plurality of cell strings arranged in a direction perpendicular to a substrate, the three-dimensional flash memory comprising:
   a first dummy word line disposed between a ground selection line and a main word line; and
   a second dummy word line disposed between the main word line and a string selection line, and being asymmetric with respect to the first dummy word line, wherein
   voltages of different levels are respectively applied to the first and second dummy word lines during a read operation, wherein
   the first and second dummy word lines are asymmetric in that: (1) the number of word lines assigned to the first dummy word line differs from the number of word lines assigned to the second dummy word line, (2) the distance between the first dummy word line and the ground selection line differs from the distance between the second dummy word line and the string selection line, or (3) the width of the first dummy word line differs from the width of the second dummy word line.

2. The three-dimensional flash memory device of claim 1, further comprising:
a voltage generator generating first and second dummy word line voltages to be applied to the first and second dummy word lines, respectively; and
a control logic controlling the voltage generator, wherein during the read operation, the control logic sets the first and second dummy word line voltages to different voltage levels such that a difference between an electric field, formed between a channel of the main word line and the ground selection line, and an electric field, formed between a channel of the main word line and the string selection line, is reduced.

3. The three-dimensional flash memory device of claim 1, wherein the distance between the first dummy word line and the ground selection line and the distance between the second dummy word line and the string selection line are set to be different from each other.

4. The three-dimensional flash memory device of claim 1, wherein the number of word lines appointed as the first dummy word line is different from the number of word lines appointed as the second dummy word line.

5. The three-dimensional flash memory device of claim 1, wherein the width of the first dummy word line is different from the width of the second dummy word line.

6. A three-dimensional flash memory device which includes a plurality of cell strings arranged in a direction perpendicular to a substrate, the three-dimensional flash memory comprising:
a memory cell array comprising upper and lower dummy word lines being asymmetric in structure;
a voltage generator generating voltages to be applied to the upper and lower dummy word line; and
a control logic controlling the memory cell array and the voltage generator, wherein the control logic controls the memory cell array and the voltage generator such that voltages of different levels are applied to the upper and lower dummy word lines, respectively, wherein
the upper and lower dummy word lines are asymmetric in that: (1) the number of word lines assigned to the upper dummy word line differs from the number of word lines assigned to the lower dummy word line, (2) the distance between the lower dummy word line and the ground selection line differs from the distance between the upper dummy word line and the string selection line, or (3) the width of the upper dummy word line differs from the width of the lower dummy word line.

7. The three-dimensional flash memory device of claim 6, wherein the memory cell array further comprises:
a plurality of cell strings connected between a bit line and a common source line; and
a plurality of string selection lines selecting a cell string, in which a read operation is performed, from among the cell strings, wherein
the control logic adjusts a difference between a voltage to be applied to the upper dummy word line and a voltage to be applied to the lower dummy word line based on the number of bits of data stored in each of memory cells included in a cell string, in which the read operation is not performed, from among the cell strings.

8. The three-dimensional flash memory device of claim 6, wherein the memory cell array further comprises:
a plurality of cell strings connected between a bit line and a common source line; and
a plurality of string selection lines selecting a cell string, in which a read operation is performed, among the cell strings, wherein
the control logic adjusts a difference between a voltage to be applied to the upper dummy word line and a voltage to be applied to the lower dummy word line based on a program/erase cycle of memory cells included in a cell string, in which the read operation is not performed, from among the cell strings.

9. The three-dimensional flash memory device of claim 6, wherein the control logic adjusts a difference between a voltage to be applied to the upper dummy word line and a voltage to be applied to the lower dummy word line based on a change in an external temperature.

10. The three-dimensional flash memory device of claim 6, wherein the control logic adjusts a difference between a voltage to be applied to the upper dummy word line and a voltage to be applied to the lower dummy word line based on a location of a memory block in which a read operation is performed.

11. The three-dimensional flash memory device of claim 10, wherein the memory cell array further comprises:
a plurality of cell strings connected between a bit line and a common source line; and
a plurality of string selection lines selecting a cell string, in which a read operation is performed, from among the cell strings, wherein
the control logic adjusts the difference between the voltage to be applied to the upper dummy word line and the voltage to be applied to the lower dummy word line based on the number of bits of data stored in each of memory cells included in a cell string, in which the read operation is not performed, from among the cell strings.

12. The three-dimensional flash memory device of claim 10, wherein the memory cell array further comprises:
a plurality of cell strings connected between a bit line and a common source line; and
a plurality of string selection lines selecting a cell string, in which a read operation is performed, from among the cell strings, wherein
the control logic adjusts the difference between the voltage to be applied to the upper dummy word line and the voltage to be applied to the lower dummy word line based on a program/erase cycle of memory cells included in a cell string, in which the read operation is not performed, from among the cell strings.

13. The three-dimensional flash memory device of claim 10, wherein the control logic adjusts the difference between the voltage to be applied to the upper dummy word line and the voltage to be applied to the lower dummy word line based on a change in an external temperature.

14. The three-dimensional flash memory device of claim 10, wherein the control logic adjusts the difference between the voltage to be applied to the upper dummy word line and the voltage to be applied to the lower dummy word line based on a location of a memory block in which a read operation is performed.

15. The three-dimensional flash memory device of claim 10, wherein the number of word lines appointed as the upper dummy word line is different from the number of word lines appointed as the lower dummy word line.

16. A three-dimensional non-volatile memory device comprising:

a substrate;

a cell string disposed perpendicular to the substrate; and a plurality of memory cells, within the cell string, that are electrically and serially connected between a bit line and a common source line, wherein:

each of the memory cells is controlled by a different word line, and the distance between the common source line and a first one of the memory cells that is closest to the common source line differs from the distance between the bit line and a second one of the memory cells that is closest to the bit line, wherein:

a voltage applied to a word line corresponding to the first one of the memory cells has a different level than a voltage applied to a word line corresponding to the second one of the memory cells during a read operation.

17. The three-dimensional non-volatile memory device of claim 16, wherein the difference equals or exceeds about twice the length of each of the memory cells.

18. The three-dimensional non-volatile memory device of claim 17, wherein the distance difference and the voltages of different levels reduces a difference between an electrical field, formed between the first memory cell and the common source line, and an electrical field, formed between the second memory cell and the bit line.

19. The three-dimensional non-volatile memory device of claim 18, wherein the difference in electrical fields is reduced proportionately to the memory cell length.

20. The three-dimensional non-volatile memory device of claim 16, wherein:

the distance between the common source line and the first memory cell corresponds to the length of one or more of the plurality of memory cells that are electrically and serially connected between the common source line and the first memory cell, and the distance between the bit line and the second memory cell corresponds to the length of one or more of the plurality of memory cells that are electrically and serially connected between the bit line and the second memory cell.

\* \* \* \* \*